(12) United States Patent
Loeffler et al.

(10) Patent No.: US 12,100,644 B2
(45) Date of Patent: Sep. 24, 2024

(54) SEMICONDUCTOR DEVICE WITH THROUGH-SUBSTRATE VIA AND METHOD OF MANUFACTURING A SEMICONDUCTOR DEVICE WITH THROUGH-SUBSTRATE VIA

(71) Applicant: ams AG, Premstätten (AT)

(72) Inventors: Bernhard Loeffler, Premstätten (AT); Thomas Bodner, Premstätten (AT); Joerg Siegert, Premstätten (AT)

(73) Assignee: AMS AG, Premstätten (AT)

( * ) Notice: Subject to any disclaimer, the term of this patent is extended or adjusted under 35 U.S.C. 154(b) by 547 days.

(21) Appl. No.: 17/415,167

(22) PCT Filed: Dec. 20, 2019

(86) PCT No.: PCT/EP2019/086704
§ 371 (c)(1),
(2) Date: Jun. 17, 2021

(87) PCT Pub. No.: WO2020/127988
PCT Pub. Date: Jun. 25, 2020

(65) Prior Publication Data
US 2022/0059434 A1    Feb. 24, 2022

(30) Foreign Application Priority Data
Dec. 21, 2018  (EP) ..................... 18215468

(51) Int. Cl.
*H01L 21/768* (2006.01)
*H01L 23/31* (2006.01)
(Continued)

(52) U.S. Cl.
CPC ...... *H01L 23/481* (2013.01); *H01L 21/76831* (2013.01); *H01L 21/76898* (2013.01);
(Continued)

(58) Field of Classification Search
CPC ......... H01L 21/76831; H01L 21/76898; H01L 23/481; H01L 23/3171; H01L 23/5226; H01L 23/5283; H01L 2224/11
See application file for complete search history.

(56) References Cited

U.S. PATENT DOCUMENTS 8,378,496 B2    2/2013  Schrank et al.
11,107,848 B2   8/2021  Enichlmair et al.
(Continued)

FOREIGN PATENT DOCUMENTS

CN    104752384 A    7/2015
CN    105074929 A    11/2015
(Continued)

OTHER PUBLICATIONS

Japanese Notice of Reasons for Rejection in Japanese Application No. 2021-526542 mailed on Sep. 6, 2022, 12 pages.
(Continued)

*Primary Examiner* — Farun Lu
*Assistant Examiner* — Sandra Milena Rodriguez Villan
(74) *Attorney, Agent, or Firm* — MH2 TECHNOLOGY LAW GROUP LLP

(57) ABSTRACT

An intermetal dielectric and metal layers embedded in the intermetal dielectric are arranged on a substrate of semiconductor material. A via hole is formed in the substrate, and a metallization contacting a contact area of one of the metal layers is applied in the via hole. The metallization, the metal layer comprising the contact area and the intermetal dielectric are partially removed at the bottom of the via hole in order to form a hole penetrating the intermetal dielectric and extending the via hole. A continuous passivation is arranged on sidewalls within the via hole and the hole, and the metallization contacts the contact area around the hole. Thus the presence of a thin membrane of layers, which is usually (Continued)

formed at the bottom of a hollow through-substrate via, is avoided.

15 Claims, 17 Drawing Sheets

(51) Int. Cl.
 *H01L 23/48* (2006.01)
 *H01L 23/522* (2006.01)
 *H01L 23/528* (2006.01)
(52) U.S. Cl.
 CPC ...... *H01L 23/3171* (2013.01); *H01L 23/5226* (2013.01); *H01L 23/5283* (2013.01)

(56) References Cited

U.S. PATENT DOCUMENTS

| | | | |
|---|---|---|---|
| 11,335,720 B2 * | 5/2022 | Shigetoshi | H01L 21/76898 |
| 2004/0217483 A1 | 11/2004 | Hedler et al. | |
| 2008/0284041 A1 * | 11/2008 | Jang | H01L 21/76898 |
| | | | 257/774 |
| 2010/0314762 A1 | 12/2010 | Schrank et al. | |
| 2012/0286430 A1 | 11/2012 | Kraft et al. | |
| 2014/0339698 A1 | 11/2014 | Cassidy et al. | |
| 2015/0303141 A1 | 10/2015 | Schrank et al. | |

FOREIGN PATENT DOCUMENTS

| | | | | |
|---|---|---|---|---|
| EP | 2597677 A1 | * | 5/2013 | ....... H01L 21/76898 |
| EP | 2741322 A1 | * | 6/2014 | ........... G01N 27/128 |
| EP | 2860560 A1 | | 4/2015 | |
| JP | 2008288595 A | | 11/2008 | |
| JP | 2010535427 A | | 11/2010 | |
| JP | 2015228473 A | * | 12/2015 | |
| JP | 2018107227 A | | 7/2018 | |
| WO | 2009013315 A2 | | 1/2009 | |
| WO | 2009017835 A2 | | 2/2009 | |
| WO | 2010081603 A1 | | 7/2010 | |
| WO | 2018123299 A1 | | 7/2018 | |

OTHER PUBLICATIONS

International Search Report and Written Opinion mailed Mar. 6, 2020 for corresponding International Application No. PCT/EP2019/086704, 13 pages.

Kraft, J. et al., "3D sensor application with open through silicon via technology," Fraunhofer Institute for Mechanics of Materials IWM Halle, Germany, 7 pages.

Schrank, F et al. "80μm open TSV technology" Technology R&D; ams AG, Minapad, 2015, 7 pages.

Kraft, J. et al., "Electrical and optical Through Silicon Vias (TSVs) for high frequency photonic applications," Technology Research and Development ams AG, IEEE 66th Electronic Components and Technology Conference, 2016, pp. 2389-2393.

Parteder, G. et al., "TSV with 40 μm diameter replacing wiring pads," ams AG, MiNaPAD, 2017, 5 pages.

Chinese Search Report mailed on Dec. 27, 2023, in corresponding Chinese Application No. CN 2019800786195. (15 pages).

Chinese Search Report mailed on Apr. 29, 2024, in corresponding Chinese Application No. CN 2019800786195, with English language translation, (13 pages).

* cited by examiner

SEMICONDUCTOR DEVICE WITH THROUGH-SUBSTRATE VIA AND METHOD OF MANUFACTURING A SEMICONDUCTOR DEVICE WITH THROUGH-SUBSTRATE VIA

CROSS-REFERENCE TO RELATED APPLICATIONS

The present application is the national stage entry of International Patent Application No. PCT/EP2019/086704, filed on Dec. 20, 2019, and published as WO 2020/127988 A1 on Jun. 25, 2020, which claims the benefit of priority of European Patent Application No. 18215468.2, filed on Dec. 21, 2018, all of which are incorporated by reference herein in their entirety.

FIELD

The present invention relates to semiconductor devices comprising a through-substrate via.

BACKGROUND OF THE INVENTION

Three-dimensional integration of semiconductor devices uses through-silicon vias or through-substrate vias (TSVs) for electric interconnections. An electrically conductive layer, which may be a metallization, is typically arranged on the wall of the via hole to form the electric interconnection, and a void is left inside the via. Thus a thin structure resembling a membrane is created at the bottom of the TSV and may include a plurality of sublayers comprising metals and dielectrics with a total thickness of typically up to 10 μm. When the semiconductor device comprising the TSV is handled during the manufacturing process, thermomechanical stress may occur in the semiconductor substrate, and the bottom structure of the TSV may be bent or even broken.

A mechanical stabilization of the bottom structure of the TSV can be achieved in different ways, such as an application of protective coatings or layers, and a reduction of the diameter of the bottom structure. A problem arising from the application of a plurality of layers is the mismatch of the coefficients of thermal expansion (CTE) of these layers. Experimental observations supported by simulations have demonstrated that cracks in the membrane are more probable if the number of layers constituting the membrane is increased.

SUMMARY OF THE INVENTION

The present disclosure provides a mechanical stabilization for through-substrate vias of semiconductor devices.

The semiconductor device comprises a substrate of semiconductor material, an intermetal dielectric on the substrate, metal layers embedded in the intermetal dielectric, a contact area of one of the metal layers, a via hole in the substrate opposite the contact area, and a metallization arranged in the via hole, the metallization contacting the contact area. A hole is arranged in the intermetal dielectric and forms an extension of the via hole. The intermetal dielectric and the metal layer comprising the contact area are penetrated by the hole. A continuous passivation is arranged on sidewalls within the via hole and the hole. The metallization contacts the contact area around the hole.

In an embodiment of the semiconductor device the via hole together with the hole extends completely through the semiconductor device. This can mean that the via hole and the hole form a passage through the semiconductor device, wherein this passage completely extends through the semiconductor device. The passage can be a channel or an opening. That the passage completely extends through the semiconductor device can mean that the passage extends completely through the substrate and the intermetal dielectric. Since the via hole together with the hole extends completely through the semiconductor device a membrane at the bottom of the through-substrate via is avoided. This means, if the via hole together with the hole does not extend completely through the semiconductor device the bottom structure of the through-substrate via could be damaged during the manufacturing process. A damage of the bottom structure of the through-substrate via is thus advantageously avoided.

In an embodiment of the semiconductor device the metallization is arranged between the continuous passivation and the sidewalls of the via hole at least in places. This can mean, that at least a part of the metallization is arranged between the continuous passivation and the sidewalls of the via hole. Thus, the continuous passivation is a passivation covering the sidewalls of the via hole and the hole as the outmost layer which faces an inner volume of the via hole and the hole. The continuous passivation can be in direct contact with an inner volume of the via hole and the hole. Advantageously, the continuous passivation is a protection for the layers arranged between the continuous passivation and the sidewalls of the via hole and the hole. The continuous passivation provides a reliable protection as it is a continuous layer extending through the via hole and the hole.

An embodiment of the semiconductor device comprises a passivation layer, the intermetal dielectric being arranged between the substrate and the passivation layer. The passivation layer abuts the continuous passivation arranged on the sidewall within the hole. The passivation layer and the continuous passivation arranged on sidewalls within the via hole and the hole adjoin one another. An advantage of this arrangement is that the passivation is not interrupted at the edges of the hole.

In a further embodiment of the semiconductor device, the via hole is clad with an insulating layer on a sidewall of the via hole, and the metallization forms a layer on the insulating layer. An advantage is that the metallization is thus insulated from the substrate to avoid short circuits, and a further advantage is that the insulation can be provided by a standard process step.

In a further embodiment of the semiconductor device, the metallization comprises an inner diameter inside the via hole, the hole comprises an inner diameter parallel to the inner diameter of the metallization, and the inner diameter of the metallization is larger than the inner diameter of the hole. An advantage of this structure is that it facilitates the application of the metallization, and a further advantage is that it can be produced by etching the hole from the side opposite the intermetal dielectric.

In a further embodiment of the semiconductor device, the metallization comprises an outer diameter inside the via hole, the hole comprises an inner diameter parallel to the outer diameter of the metallization, and the outer diameter of the metallization equals the inner diameter of the hole. An advantage of this structure is that a step or discontinuity inside the metallization is thus avoided.

In a further embodiment of the semiconductor device, the continuous passivation is formed by a continuous passivation layer. An advantage of the continuous passivation layer is that it secures a continuous passivation, and a further advantage is that it can be applied in a single process step.

A further embodiment of the semiconductor device comprises a passivation layer of the continuous passivation in the via hole and a further passivation layer of the continuous passivation in the hole, and the passivation layer abuts the further passivation layer. An advantage of this arrangement is that the passivation layers can be applied from opposite sides, and a smaller depth of the layers is required.

In a further embodiment of the semiconductor device, a pedestal is formed by the further passivation layer where the further passivation layer abuts the passivation layer. This shape of the further passivation layer secures that the passivation layers adjoin each other and a continuous passivation is thus obtained.

The semiconductor device can be implemented in a variety of applications. It is especially useful in photonic devices, for example, high-frequency photonic devices. The application of the semiconductor device in photonic devices has the advantage that the open via can be used for an optical transmission that does not suffer from absorption or diffraction.

Such applications include 3D cameras, for example, structured light cameras, time-of-flight cameras and stereoscopic imaging devices, CMOS imaging sensors, for example, rolling shutter image sensors, line scan image sensors and camera modules, lidar detectors using vertical-cavity surface-emitting lasers, various light sensors, for example, ambient light sensors, colour sensors, proximity sensors, gesture sensors, devices for optical character recognition or edge detection, for example, in products such as copiers, document scanners, spectral sensing devices or spectrum analyzers.

In the method of producing a semiconductor device, an intermetal dielectric and metal layers embedded in the intermetal dielectric are arranged on a surface of a substrate of semiconductor material, a via hole is formed in the substrate, a metallization is applied in the via hole, the metallization contacting a contact area of one of the metal layers, and a mask comprising an opening above the via hole is applied. A hole is formed by partially removing the metallization, the metal layer comprising the contact area and the intermetal dielectric through the opening of the mask, so that the hole penetrates the intermetal dielectric and extends the via hole. A continuous passivation is formed on sidewalls within the via hole and the hole.

In a variant of the method, a passivation layer is arranged on the intermetal dielectric opposite the surface of the substrate, and the continuous passivation is formed abutting the passivation layer. The passivation layer and the continuous passivation arranged on sidewalls within the via hole and the hole adjoin one another. An advantage of this arrangement is that the passivation is not interrupted at the edges of the hole, and a further advantage is that the passivation is easily produced in this way.

In a further variant of the method, the mask is applied above the surface of the substrate. Applying the mask above the surface allows to produce the hole from the side where the intermetal dielectric is present, which requires a smaller etching depth. For example, before the hole is formed, a further passivation layer is applied on the sidewall within the via hole, and after the hole is formed, a further passivation layer is applied on the sidewall within the hole, the further passivation layers forming the continuous passivation. This arrangement has the advantage that the passivation on the sidewall within the hole adjoins both the passivation on the sidewall of the via hole and the further passivation layer, and the connection of the passivation layers at the edges of the hole is more precisely produced in this way.

In a further variant of the method, the mask is applied above an opposite surface of the substrate. Applying the mask above the opposite surface allows to produce the hole directly through the via hole in essentially the same method step, thus facilitating the process. For example, after the hole is formed, a further passivation layer is applied on the sidewalls within the via hole and the hole to form the continuous passivation. Producing the hole directly through the via hole and forming the continuous passivation in one step both in the via hole and in the hole facilitates the process of forming a continuous passivation and improves the passivation.

Before the hole is formed, a handling wafer can be attached to the intermetal dielectric. Then the further passivation layer is applied, a bottom portion of the further passivation layer covering an area of the handling wafer at the bottom of the hole, and the bottom portion is removed using a further mask, which is applied above the opposite surface of the substrate. Alternatively, the bottom portion is removed from the side above the surface of the substrate.

A top metal can be formed above an opposite surface of the substrate, the top metal being electrically connected to the metallization, a passivation layer is applied on the metallization and the top metal, a further mask with an opening above a contact area of the top metal is applied, and the passivation layer is removed from the contact area through the opening of the further mask.

After the passivation layer is applied and the hole is formed, a further passivation layer can be applied on the sidewalls within the via hole and the hole to form the continuous passivation, the further passivation layer comprising a bottom portion at a bottom of the hole, the further mask is applied after the formation of the further passivation layer, and the further mask is also used to remove the bottom portion of the further passivation layer.

The following is a detailed description of examples of the semiconductor device and examples of the method of production in conjunction with the appended figures, which are not drawn to scale.

DETAILED DESCRIPTION

Figure 1:
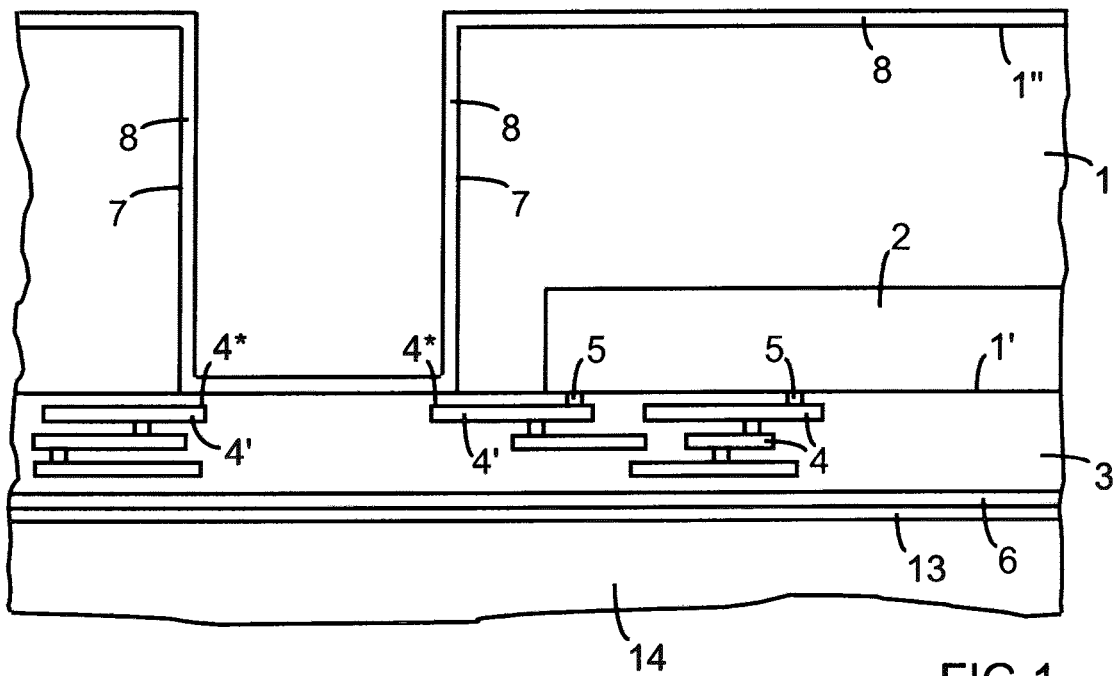
FIG. 1 is a cross section of an intermediate product of a semiconductor device comprising a via hole and including a handling wafer.

FIG. 1 is a cross section of a semiconductor device comprising a through-substrate via. It comprises a substrate 1 of semiconductor material, which may be silicon, for instance. Components of an integrated circuit 2, which is schematically indicated, can be CMOS components, for instance. An intermetal dielectric 3 is arranged on a surface 1' of the substrate 1. Structured metal layers 4 are embedded in the intermetal dielectric 3 and connected with vertical interconnections 5 to form a wiring of the integrated circuit 2.

One of the metal layers 4' comprises a contact area 4*, which is provided for a through-substrate via, for example, a through-silicon via in the case of a silicon substrate. The semiconductor material on the inner wall of the via hole 7 can be covered with an insulating layer 8, which may comprise an oxide of the semiconductor material and/or a doped region of the semiconductor material. The insulating layer 8 can also be provided on the opposite surface 1" of the substrate 1, outside the via hole 7, as shown in FIG. 1 by way of example.

A handling wafer 14 is fastened to the device and can be bonded to the intermetal dielectric 3. In the example shown in FIG. 1, a passivation layer 6 can be arranged on the intermetal dielectric 3 on the side facing away from the surface 1' of the substrate 1. A bonding layer 13, which may be an adhesive layer or may comprise an oxide of the semiconductor material, for instance, can be arranged between the passivation layer 6 and the handling wafer 14.

Figure 2:
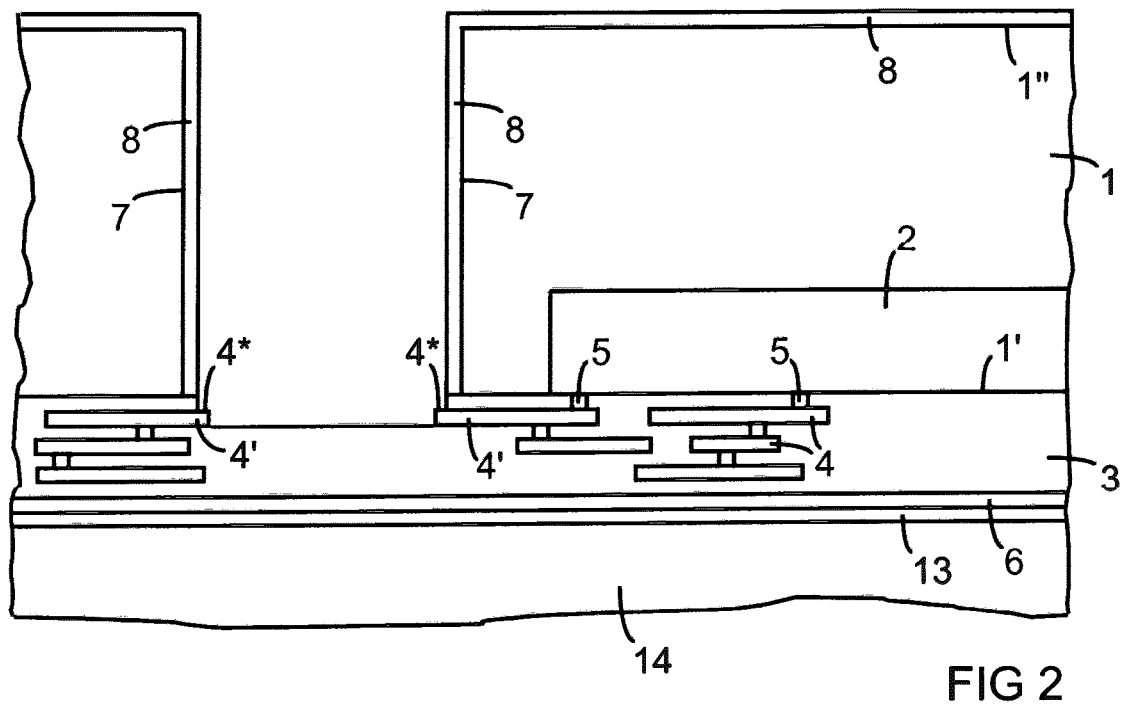
FIG. 2 is a cross section according to FIG. 1 after a partial removal of a dielectric layer.

FIG. 2 is a cross section according to FIG. 1 after an etching step, whereby a portion of the dielectric layer 3 is removed at the bottom of the via hole 7. Thus the contact area 4* is uncovered. The depth of the etching is controlled by the etch rate and the duration of the etching step.

Figure 3:
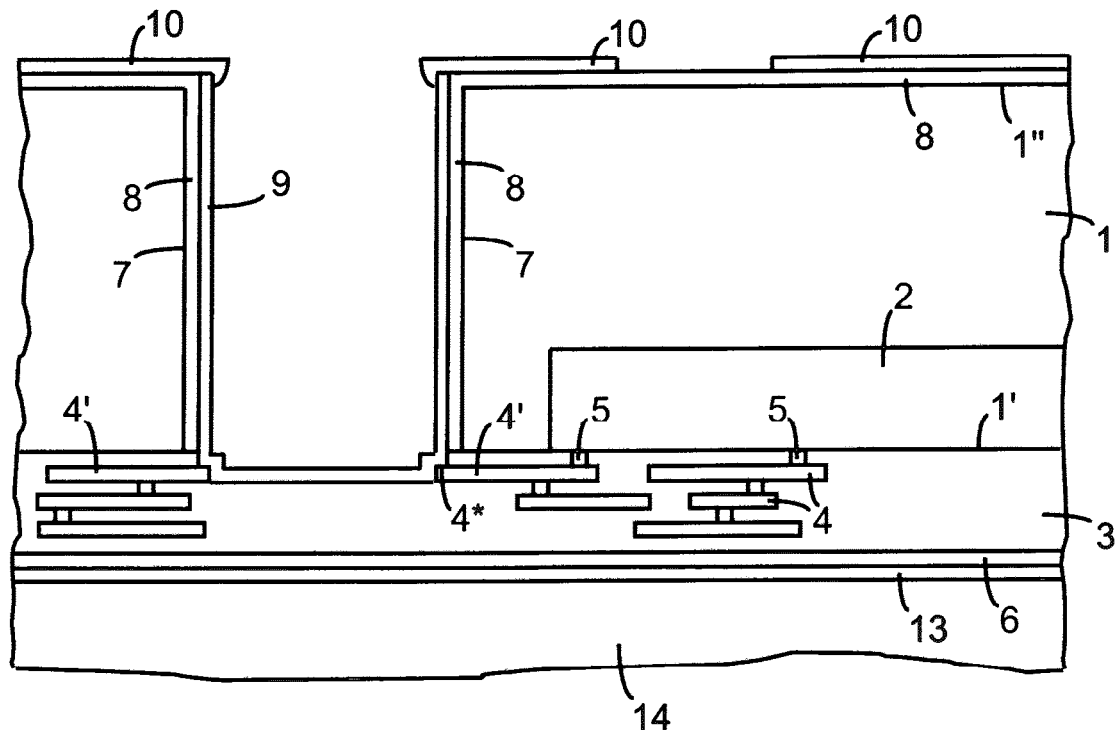
FIG. 3 is a cross section according to FIG. 2 after the application of a metallization in the via hole and a top metal outside the via hole

FIG. 3 is a cross section according to FIG. 2 after the formation of an electrically conductive interconnection through the via hole 7. A metallization 9 is applied in the via hole 7 on the insulating layer 8, the metallization 9 contacting the contact area 4*. A top metal 10 is arranged above the opposite surface 1" of the substrate 1 and can especially be insulated from the semiconductor material by the insulating layer 8. The top metal 10 can be part of the metallization 9 or a separate layer electrically connected to the metallization 9 and can comprise two or more partial layers including a barrier layer, for instance. The top metal 10 can be structured as indicated in FIG. 3.

The intermetal dielectric 3 can be much thinner than the substrate 1. Consequently, the layers at the bottom of the through-substrate via can form a relatively thin membrane, which is liable to being damaged, thus adversely affecting the manufacturing process or the function of the device. The further process steps aim at avoiding the presence of the membrane.

Figure 4:
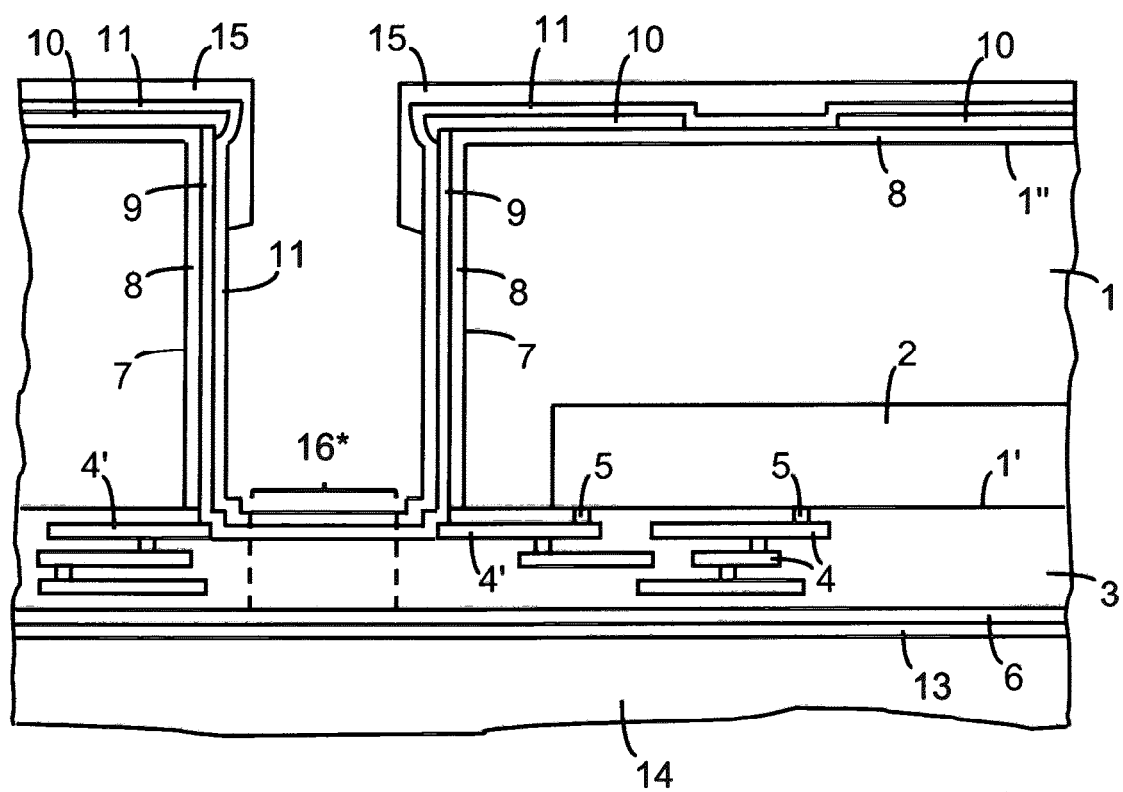
FIG. 4 is a cross section according to FIG. 3 after the application of a passivation layer on the top metal and the subsequent application of a mask.

FIG. 4 is a cross section according to FIG. 3 after the application of a passivation layer 11 on the top metal 10 and a mask 15 above the opposite surface 1" of the substrate 1. The passivation layer 11 can be arranged on the sidewall within the via hole 7, and it can also be arranged above the opposite surface 1", so that it may completely cover the top metal 10 and can provide a conformal coating. The passivation layer 11 comprises a dielectric material, such as silicon dioxide, which can be applied by deposition.

The mask 15 may be a resist mask, for instance, and is used in an anisotropic etching step, whereby the metallization 9 is removed from an area of the intermetal dielectric 3.

The lateral boundaries of the region 16* of material that is to be removed are indicated in FIG. 4 by vertical broken lines.

Figure 5:
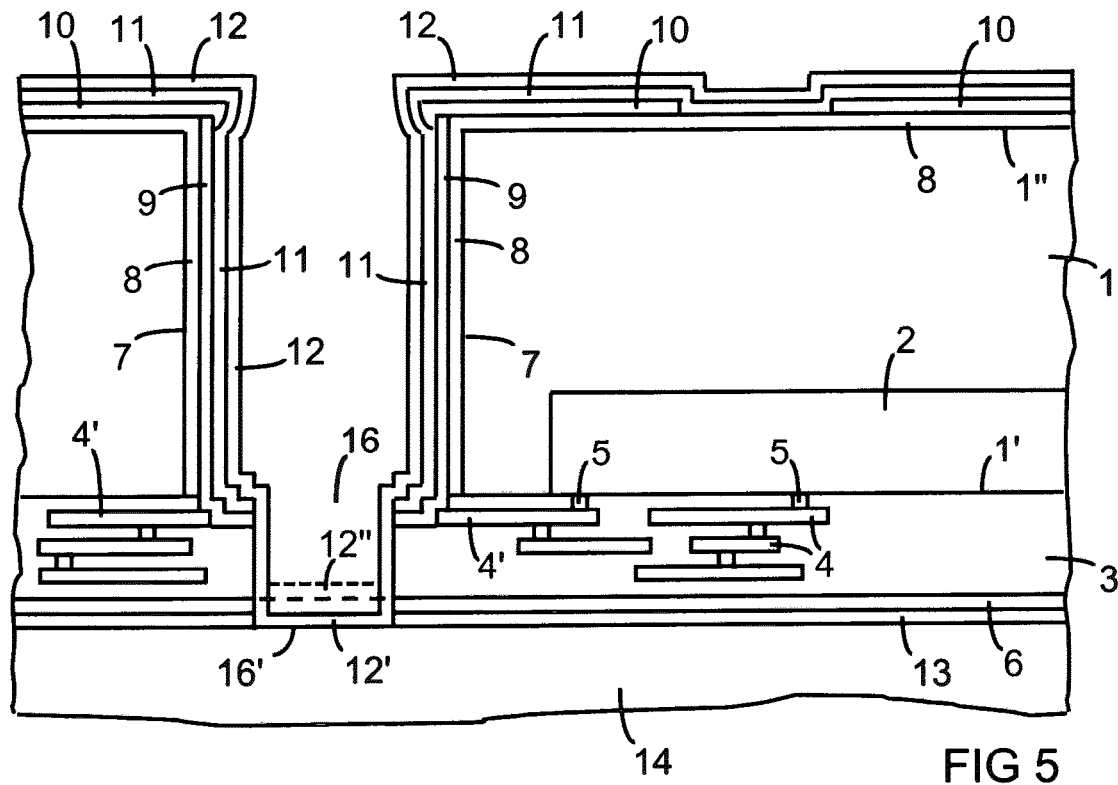
FIG. 5 is a cross section according to FIG. 4 after the formation of a hole extending the via hole, the removal of the mask and the application of a further passivation layer.

FIG. 5 is a cross section according to FIG. 4 after the formation of a hole 16 in the region 16* indicated in FIG. 4 by vertical broken lines. The mask 15 has been removed. The hole 16 extends the via hole 7 through the wiring. Thus the thin membrane of layers at the bottom of the through-substrate via is removed, and the risk of a damage caused by cracks in the membrane is avoided. The passivation layer 6 and the bonding layer 13 may also be removed at the bottom 16' of the hole 16, but especially the bonding layer 13, which can serve as an etch stop layer, may still be present, at least partially, at the bottom 16' of the hole 16. This option is indicated in FIG. 5 by a horizontal broken line.

A further passivation layer 12, which may comprise $Si_3N_4$, for instance, can then be applied on the passivation layer 11, especially on the surface within the via hole 7, and on the surface within the hole 16 including the bottom 16', where a bottom portion 12', 12" of the further passivation layer 12 is arranged. The further passivation layer 12 may also be applied above the top metal 10. The metallization 9 is arranged between the sidewall of the via hole 7 and the further passivation layer 12 in places.

FIG. 5 shows the case in which the bonding layer 13 has been removed from the bottom 16' of the hole 16, and the bottom portion 12' of the further passivation layer 12 is applied on a surface area of the handling wafer 14. If the passivation layer 6 has not been removed from the bottom 16' of the hole 16, the further passivation layer 12 comprises an alternative bottom portion 12", which is located on the passivation layer 6. The alternative bottom portion 12" is indicated in FIG. 5 by a dotted line.

Figure 6:
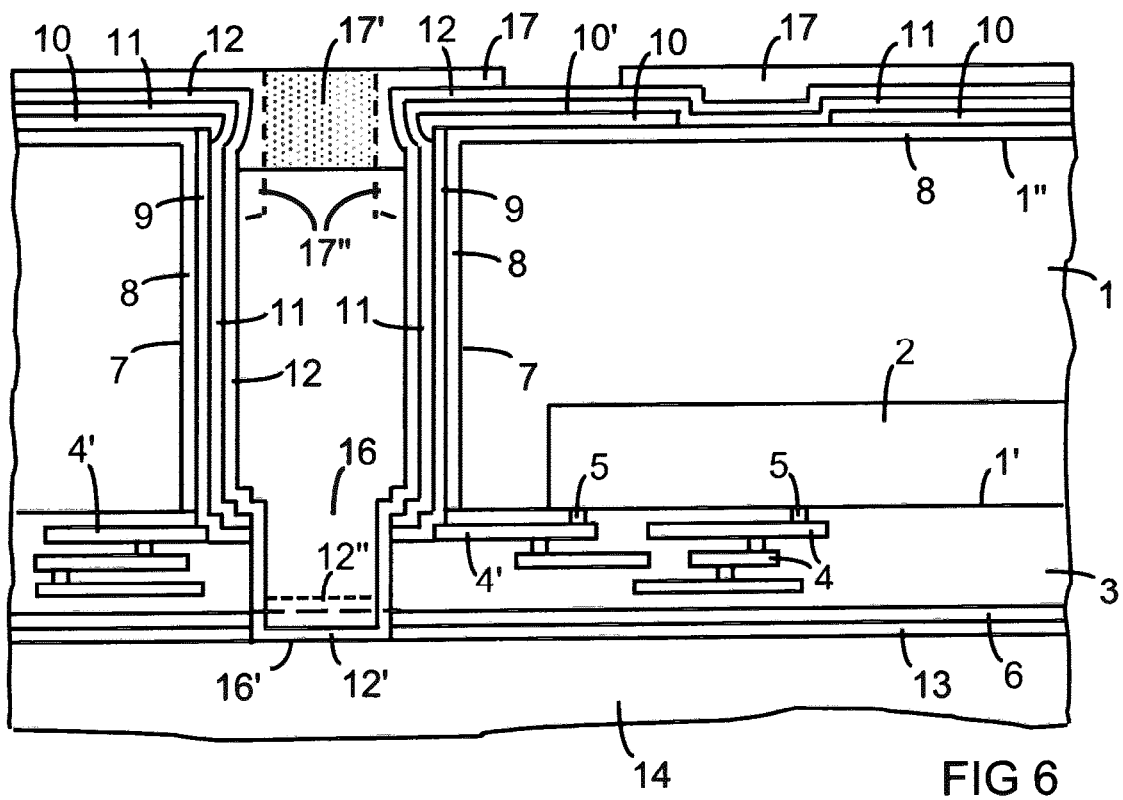
FIG. 6 is a cross section according to FIG. 5 after the application of a further passivation layer and a further mask.

FIG. 6 is a cross section according to FIG. 5 after the application of a further mask 17, which may also be a resist mask, for instance. The further mask 17 is used to remove the passivation layer 11 and the further passivation layer 12 above a contact area 10' of the top metal 10. The further passivation layer 12 may optionally be removed in an area of the bottom 16' of the hole 16 by an anisotropic etching step. In this case the optional mask region 17' indicated in FIG. 5 by a dotted area is absent, and the further mask 17 may include an alternative mask region 17" framing the opening of the mask, as shown in FIG. 5 by vertical broken lines. If the bonding layer 13 is still present at the bottom 16' of the hole 16, the further mask 17 can also be used to remove the bonding layer 13, from the bottom 16' of the hole 16. The handling wafer 14 may be used as an etch stop in this case.

Figure 7:
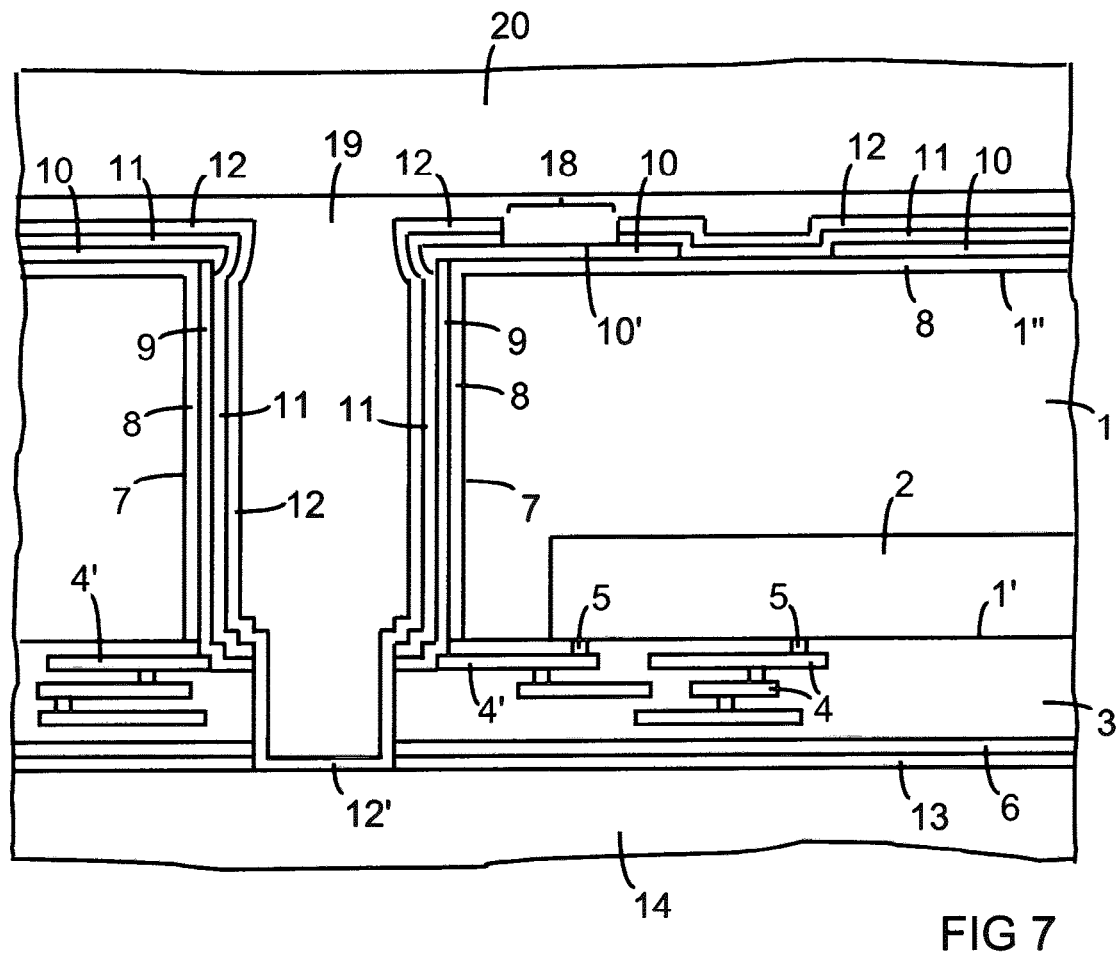
FIG. 7 is a cross section according to FIG. 6 after the passivation layers are structured and a further handling wafer is applied.

FIG. 7 is a cross section according to FIG. 6 after the passivation layers 11, 12 are structured and a further handling wafer 20 is attached. A bonding and filler material 19, which may comprise an adhesive or an oxide of the semiconductor material, for instance, is applied in the via hole 7 and to the top surface including the remaining upper portions of the passivation layer 11 and the further passivation layer 12. The bonding and filler material 19 may fill the hole 16 and the inner void of the via hole 7, which is not filled with the metallization 9. The further handling wafer 20 can be fastened to the bonding and filler material 19.

FIG. 7 shows the case in which the bottom portion 12' of the further passivation layer 12 is applied directly on the handling wafer 14 and is still present when the further handling wafer 20 is attached. This illustration corresponds to the first alternative case including the optional mask region 17' and the bottom portion 12' as shown in FIG. 6.

Figure 8:
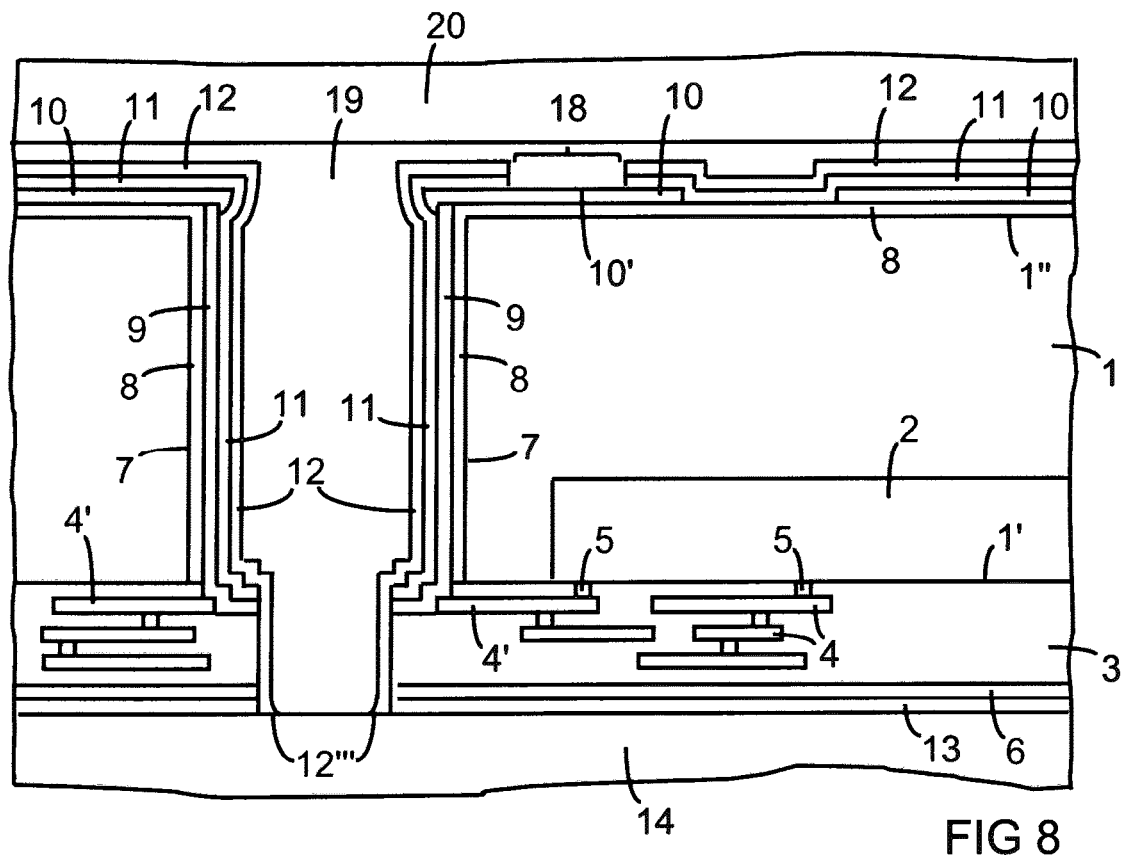
FIG. 8 is a cross section according to FIG. 6, and an alternative to FIG. 7, after the passivation layers are structured and removed from the bottom of the hole and a further handling wafer is applied.

FIG. 8 is a cross section according to FIG. 7 for the second alternative case, in which the further passivation layer 12 is removed from the bottom 16' of the hole 16 by an essentially anisotropic etching step using the further mask 17 having an opening instead of the optional mask region 17', and FIG. 8 shows the intermediate product thus obtained after the removal of the further mask 17. The further passivation layer 12 still covers the sidewall of the hole 16 as a layer of essentially constant thickness. Small protrusions 12''' of the further passivation layer 12 may remain at the bottom 16' of the hole 16. These protrusions 12''' may be removed in a later process step. In any case the passivation layer 6 and the further passivation layer 12 adjoin one another, so that the passivation layers 6, 12 form a continuous passivating layer and the passivation is not interrupted at the edges of the hole 16.

Figure 9:
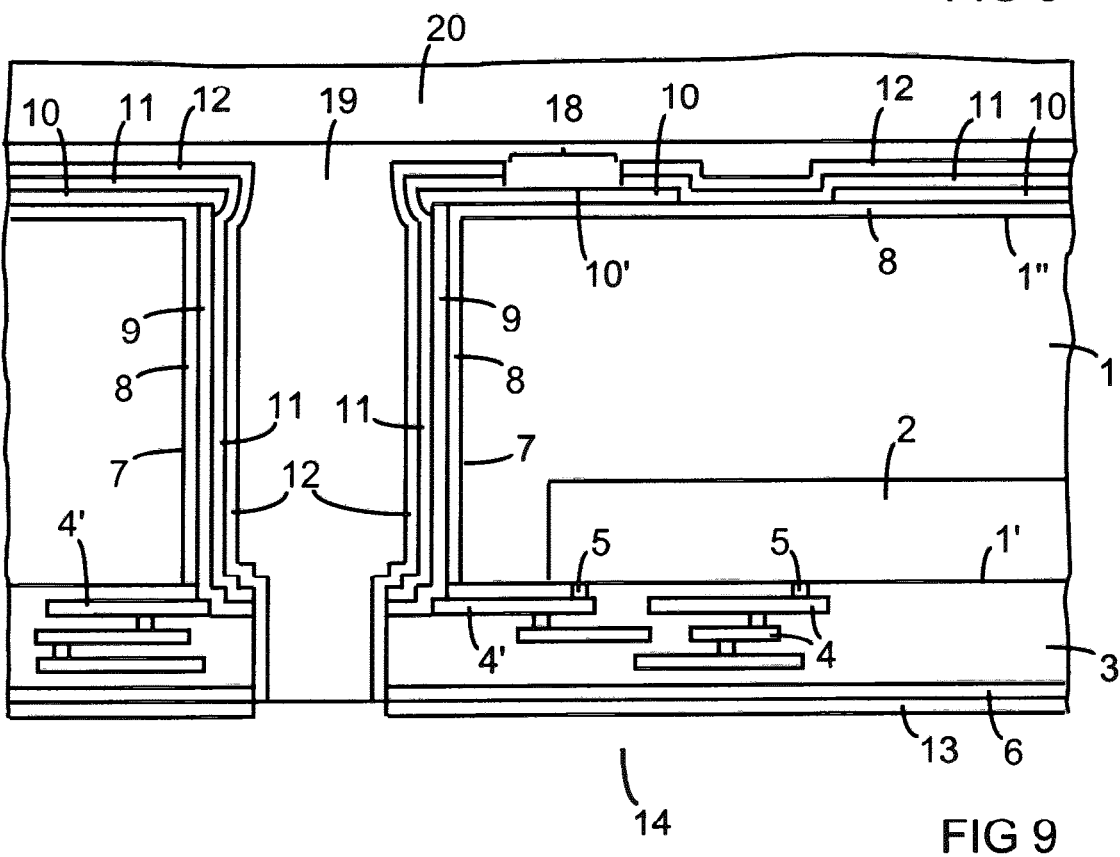
FIG. 9 is a cross section according to FIG. 7 after the removal of the handling wafer and the removal of the further passivation layer from the bottom of the hole.

FIG. 9 is a cross section according to FIG. 7 after the removal of the handling wafer 14 and the bottom portion 12' of the further passivation layer 12. If the further passivation layer 12 comprises the alternative bottom portion 12", sections of the bonding layer 13 and optionally the passivation layer 6 are still present between the bonding and filler material 19 and the alternative bottom portion 12", and these sections are also removed until the bonding and filler material 19 is exposed. FIG. 9 shows how the bottom surface of the bonding and filler material 19 is laid bare after this process step.

Figure 10:
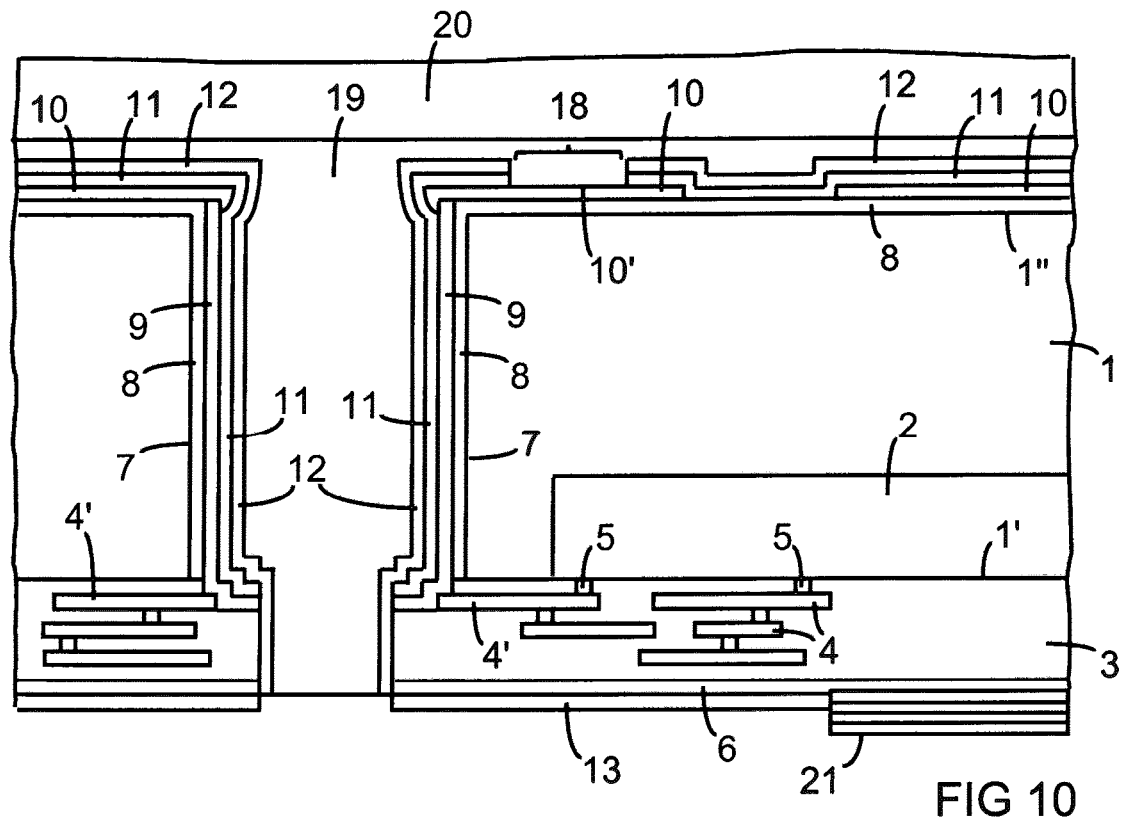
FIG. 10 is a cross section according to FIG. 9 after an application of an optional component.

FIG. 10 is a cross section according to FIG. 9 after an application of an optional component 21, which may be an optical filter, for instance. The optional component 21 can be formed on the surface of the passivation layer 6 and above optically sensitive elements of the integrated circuit 2, for instance.

Figure 11:
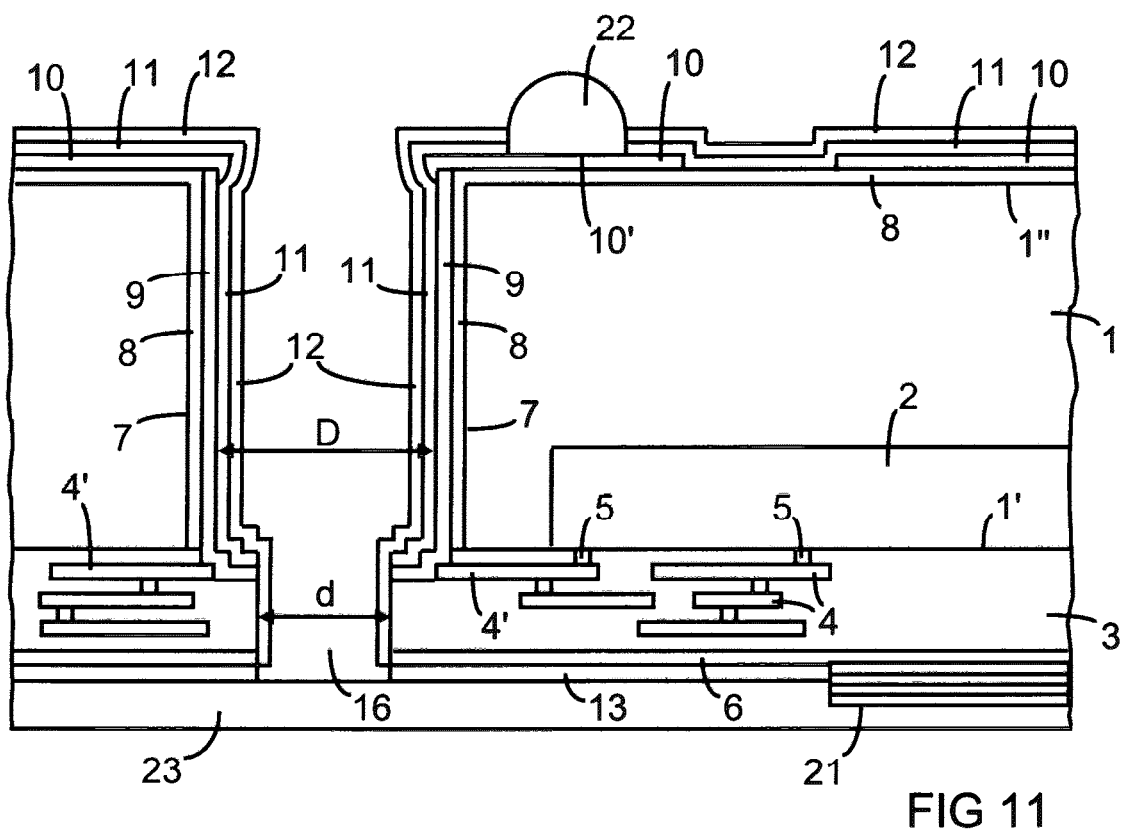
FIG. 11 is a cross section according to FIG. 10 after the removal of the further handling wafer and an application of solder balls.

FIG. 11 is a cross section according to FIG. 10 after the removal of the further handling wafer 20 and the bonding and filler material 19. To aid these process steps, a tape 23, for example, an adhesive tape 23, can be applied to the device above the surface 1'. The further passivation layer 12 abuts the passivation layer 6. A solder ball 22 can be applied to the contact area 10' of the top metal 10, as shown in FIG. 11. The solder ball 22 can serve as an outer electric terminal of the electric interconnection through the substrate 1, which is formed by the metallization 9. An inner diameter D of the metallization 9 is typically larger than the diameter d of the hole 16, because the metallization 9 extends onto the contact area 4* surrounding the hole 16. The via hole 7 together with the hole 16 extends completely through the substrate 1 and the intermetal dielectric 3. This means, the via hole 7 together with the hole 16 extends completely through the semiconductor device. Further process steps may follow before and after the tape 23 is removed.

Figure 12:
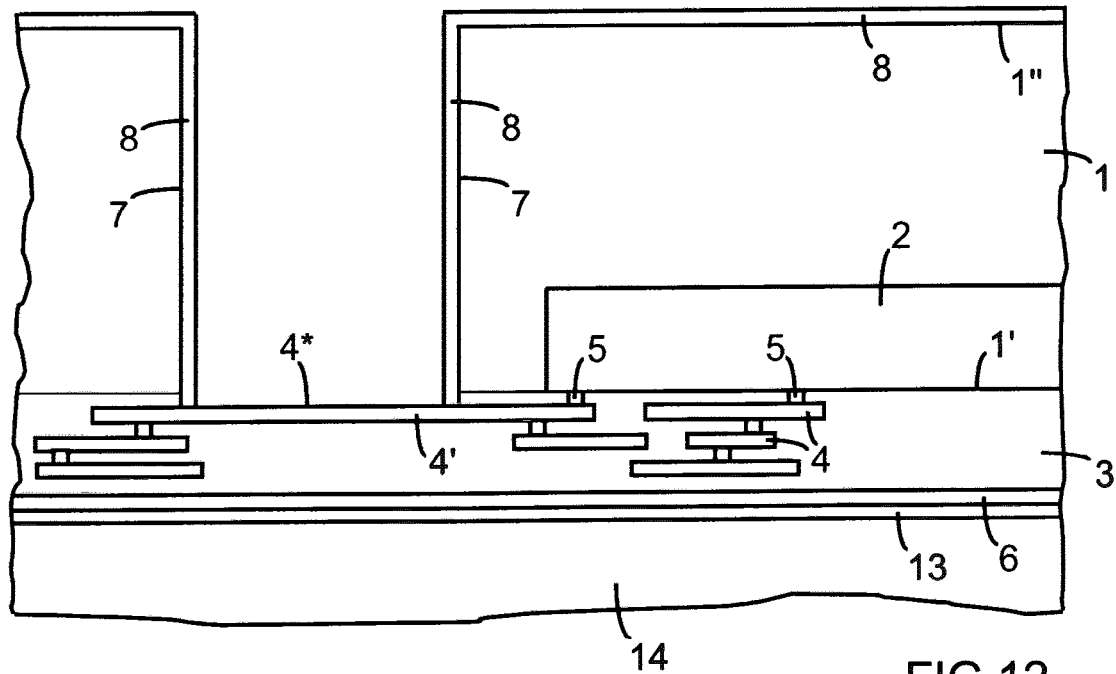
FIG. 12 is a cross section of an intermediate product of a semiconductor device comprising a via hole and including a handling wafer as an alternative to FIG. 2.

FIG. 12 is a cross section according to FIG. 2 for an alternative structure. The elements corresponding to elements shown in FIG. 2 are designated in FIG. 12 with the same reference numerals. In the alternative structure, the metal layer 4' comprising the contact area 4* is present in the entire area of the bottom of the via hole 7. Hence this metal layer 4' can be employed as an etching stop layer in the etching step that is applied to remove the upper portion of the intermetal dielectric 3 beneath the via hole 7.

Figure 13:
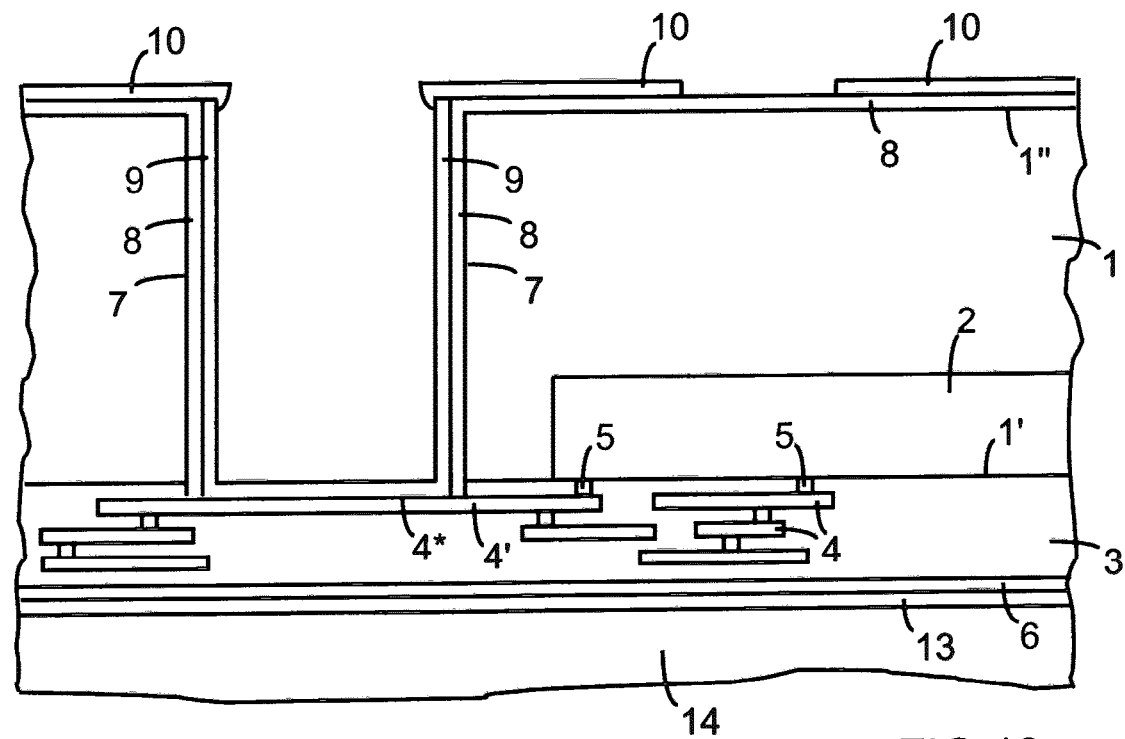
FIG. 13 is a cross section according to FIG. 12 after the application of a metallization in the via hole and a top metal outside the via hole.

FIG. 13 is a cross section according to FIG. 12 after the application of the metallization 9 in the via hole 7 and on the contact area 4*, as well as a top metal 10 outside the via hole 7.

Figure 14:
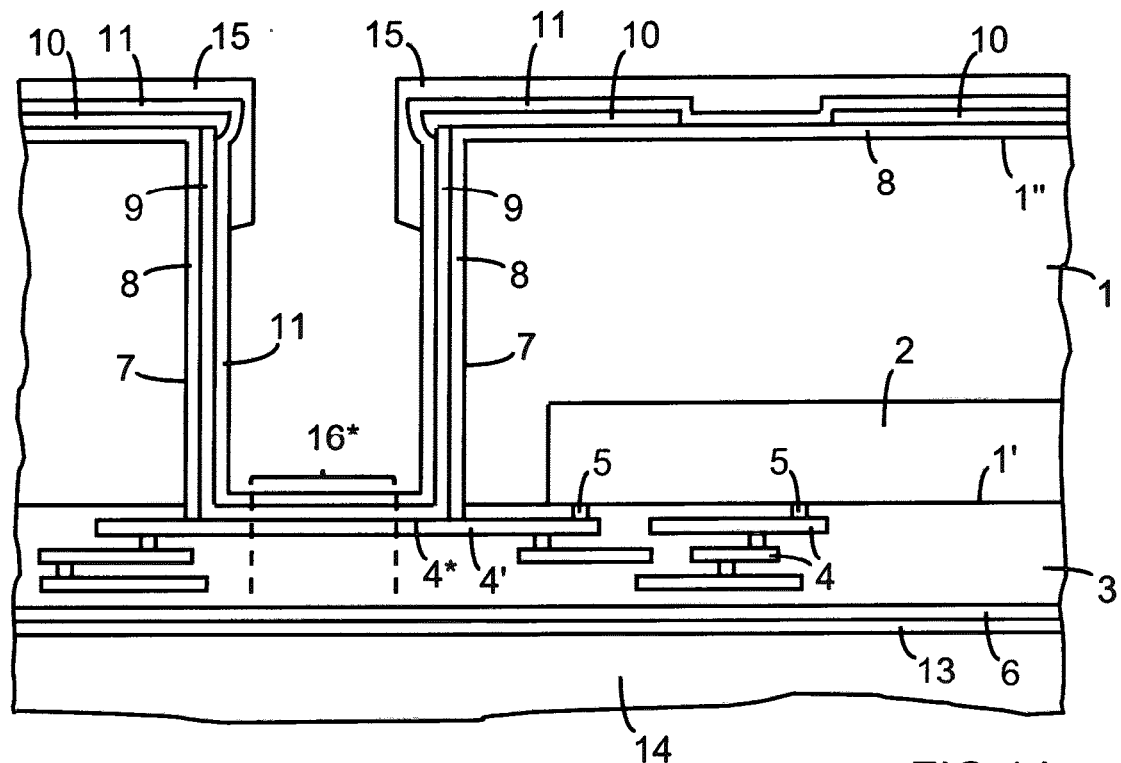
FIG. 14 is a cross section according to FIG. 13 after the application of a passivation layer on the top metal and the subsequent application of a mask.

FIG. 14 is a cross section according to FIG. 13 after the application of the passivation layer 11 on the top metal 10 and the subsequent application of the mask 15 as described above. The hole 16 is formed in the region 16\* indicated in FIG. 14 by vertical broken lines. A portion of the metal layer 4' comprising the contact area 4\* and a region of the intermetal dielectric 3 below are removed.

Figure 15:
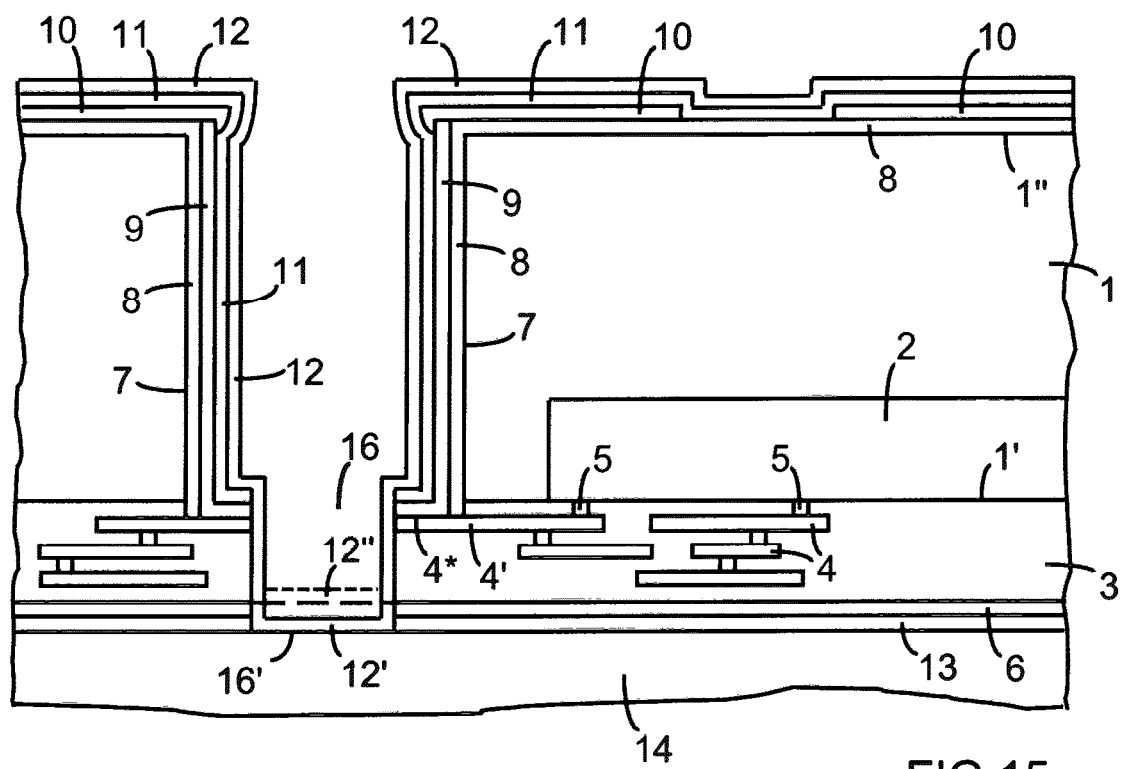
FIG. 15 is a cross section according to FIG. 14 after the formation of a hole extending the via hole, the removal of the mask and the application of a further passivation layer.

FIG. 15 is a cross section according to FIG. 14 after the formation of the hole 16 extending the via hole 7. The mask 15 has been removed. The bottom portion 12', 12" of the further passivation layer 12 can be applied as described above in conjunction with FIG. 5.

Figure 16:
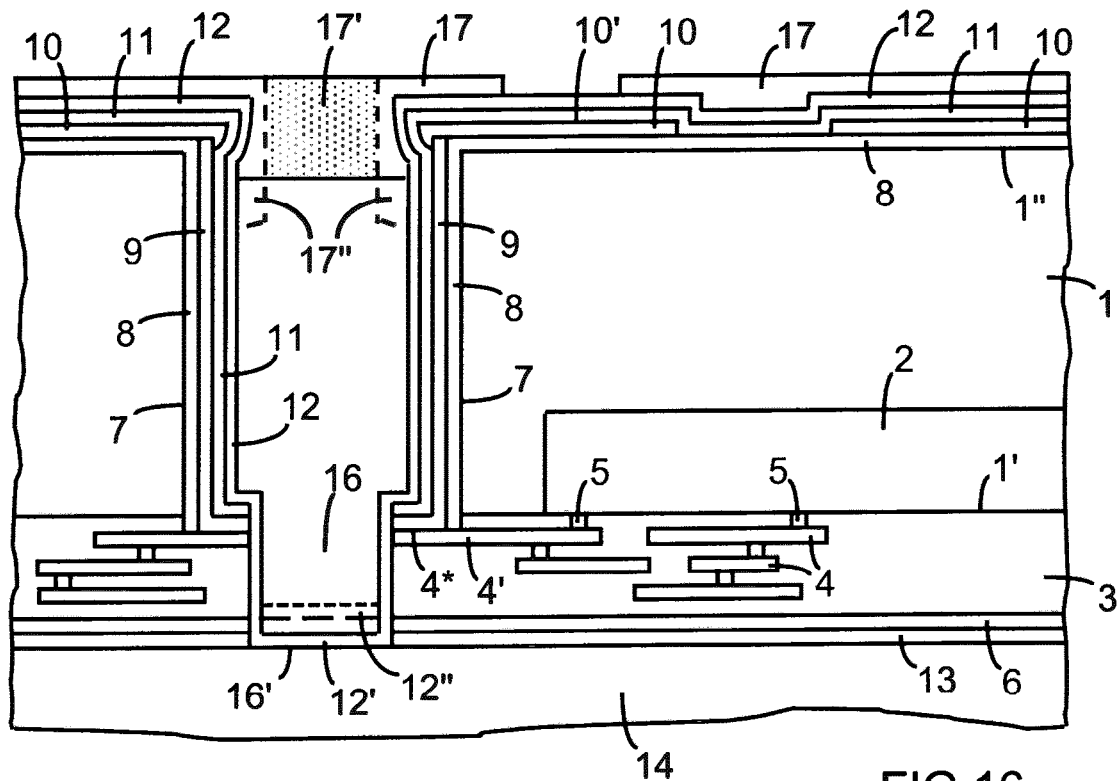
FIG. 16 is a cross section according to FIG. 15 after the application of a further passivation layer and a further mask.

FIG. 16 is a cross section according to FIG. 15 after the application of the further passivation layer 12 and the further mask 17. The further mask 17 may comprise an optional mask region 17' or an alternative mask region 17" as described above.

Figure 17:
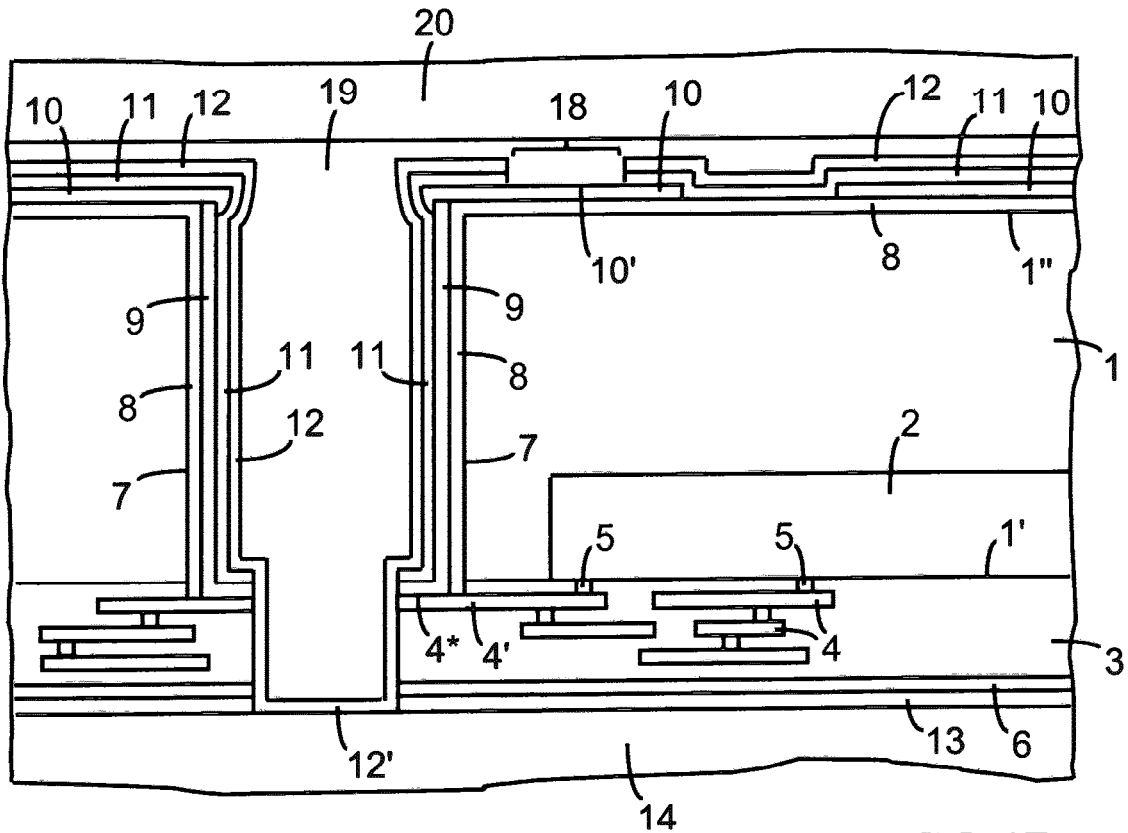
FIG. 17 is a cross section according to FIG. 16 after the passivation layers are structured and a further handling wafer is applied.

FIG. 17 is a cross section according to FIG. 16 after the passivation layers 11, 12 are structured, and the bonding and filler material 19 and the further handling wafer 20 are applied. FIG. 17 shows the case in which the bonding layer 13 has been removed from the bottom 16' of the hole 16, and the bottom portion 12' of the further passivation layer 12 is applied on a surface area of the handling wafer 14.

Figure 18:
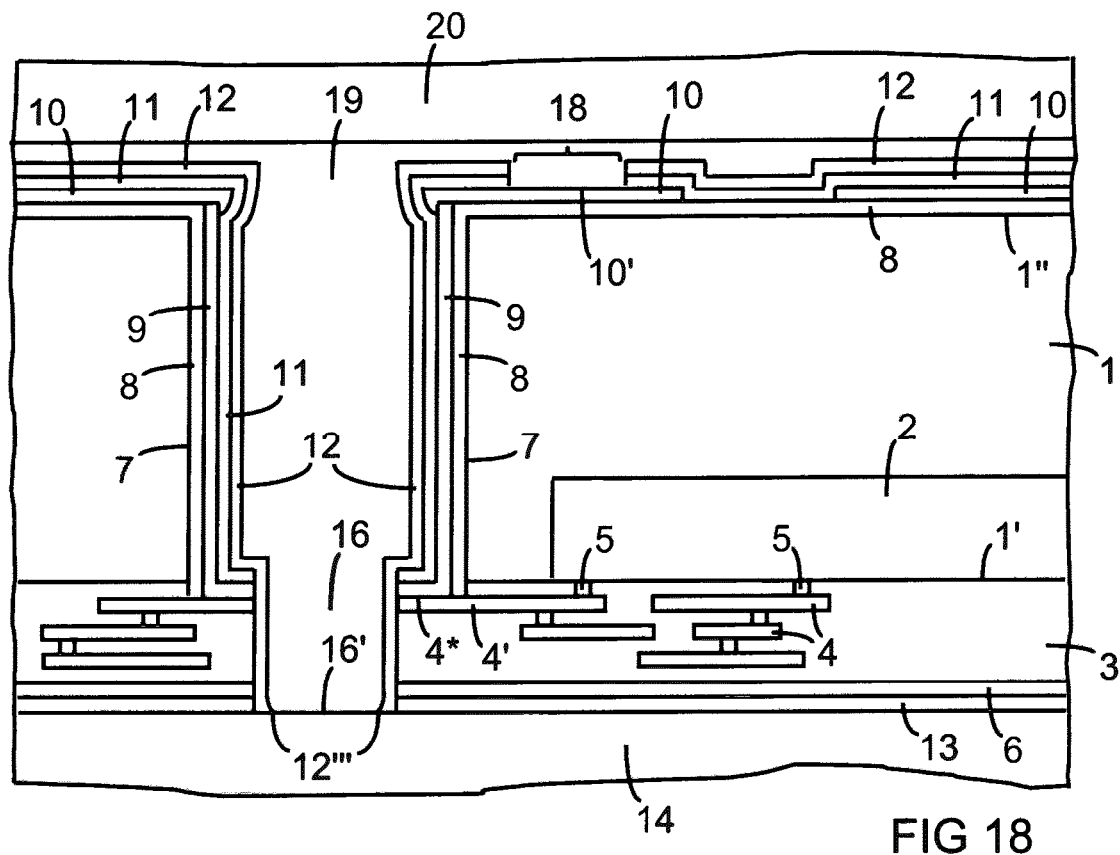
FIG. 18 is a cross section according to FIG. 16, and an alternative to FIG. 17, after the passivation layers are structured and removed from the bottom of the hole and a further handling wafer is applied.

FIG. 18 is a cross section according to FIG. 16, and an alternative to FIG. 17, after the passivation layers 11, 12 are structured and removed from the bottom of the hole 16, and the bonding and filler material 19 and the further handling wafer 20 are applied. In the example of FIG. 18, the further passivation layer 12 is removed from the bottom 16' of the hole 16 by an essentially anisotropic etching step using the further mask 17. The further passivation layer 12 still covers the sidewall of the hole 16, and the small protrusions 12''' may remain at the bottom 16' of the hole 16 or later be removed.

Figure 19:
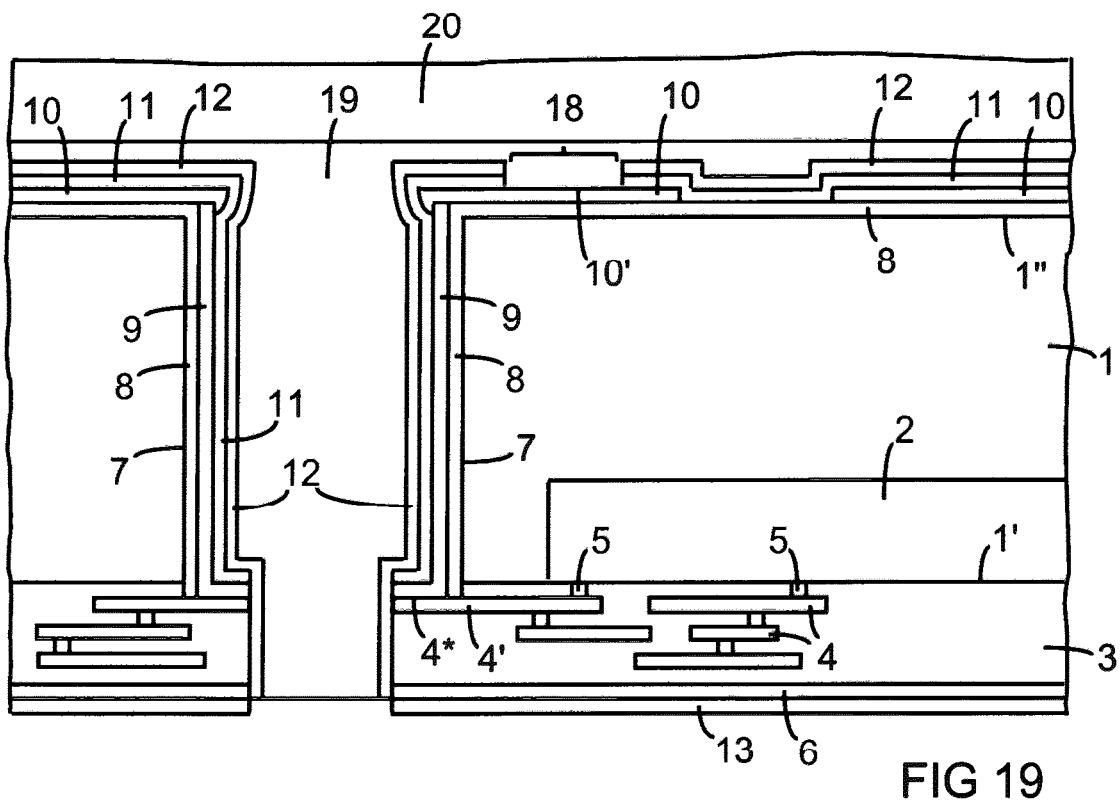
FIG. 19 is a cross section according to FIG. 17 after the removal of the handling wafer and the removal of the further passivation layer from the bottom of the hole.

FIG. 19 is a cross section according to FIG. 17 after the removal of the handling wafer and the removal of the further passivation layer 12 from the bottom of the hole 16. If the further passivation layer 12 comprises the alternative bottom portion 12", sections of the bonding layer 13 and optionally the passivation layer 6 are still present between the bonding and filler material 19 and the alternative bottom portion 12", and these sections are also removed until the bonding and filler material 19 is exposed. FIG. 19 shows how the bottom surface of the bonding and filler material 19 is laid bare after this process step.

Figure 20:
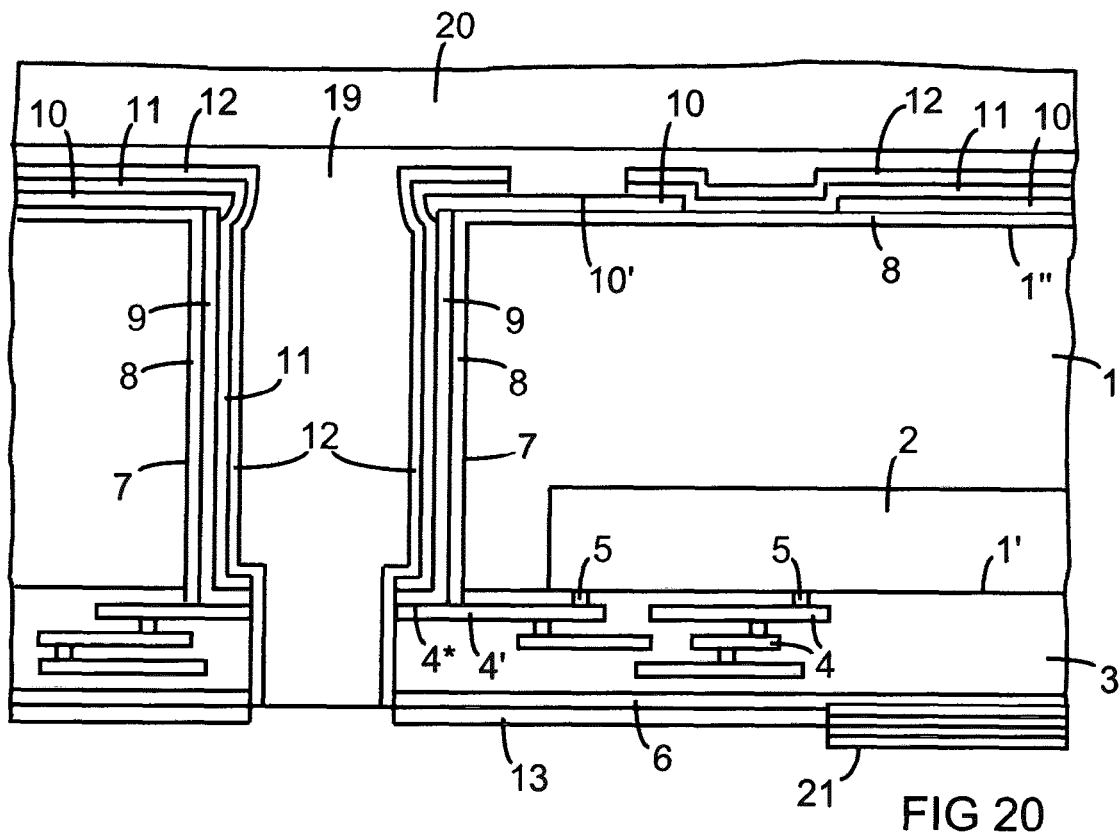
FIG. 20 is a cross section according to FIG. 19 after an application of an optional component.

FIG. 20 is a cross section according to FIG. 19 after an application of an optional component.

Figure 21:
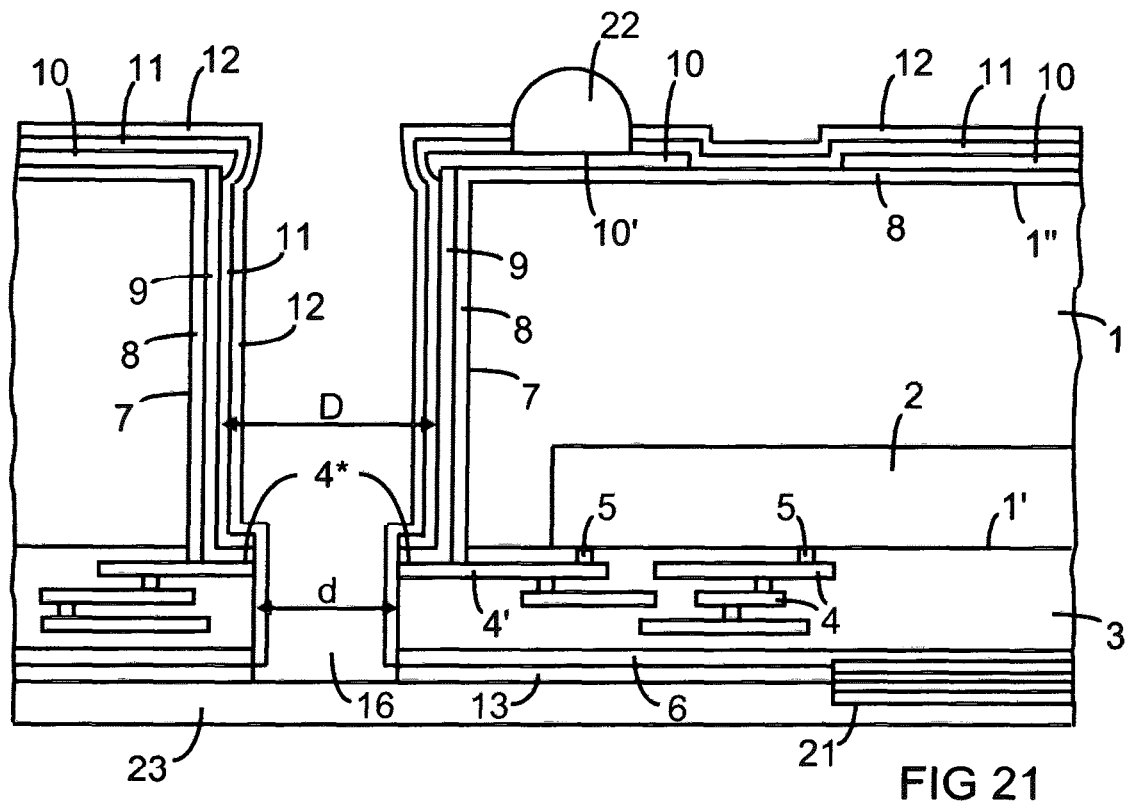
FIG. 21 is a cross section according to FIG. 20 after the removal of the further handling wafer and an application of solder balls.

FIG. 21 is a cross section according to FIG. 20 after the removal of the further handling wafer and an application of solder balls, similar to the device shown in FIG. 11. The via hole 7 together with the hole 16 extends completely through the semiconductor device.

Figure 22:
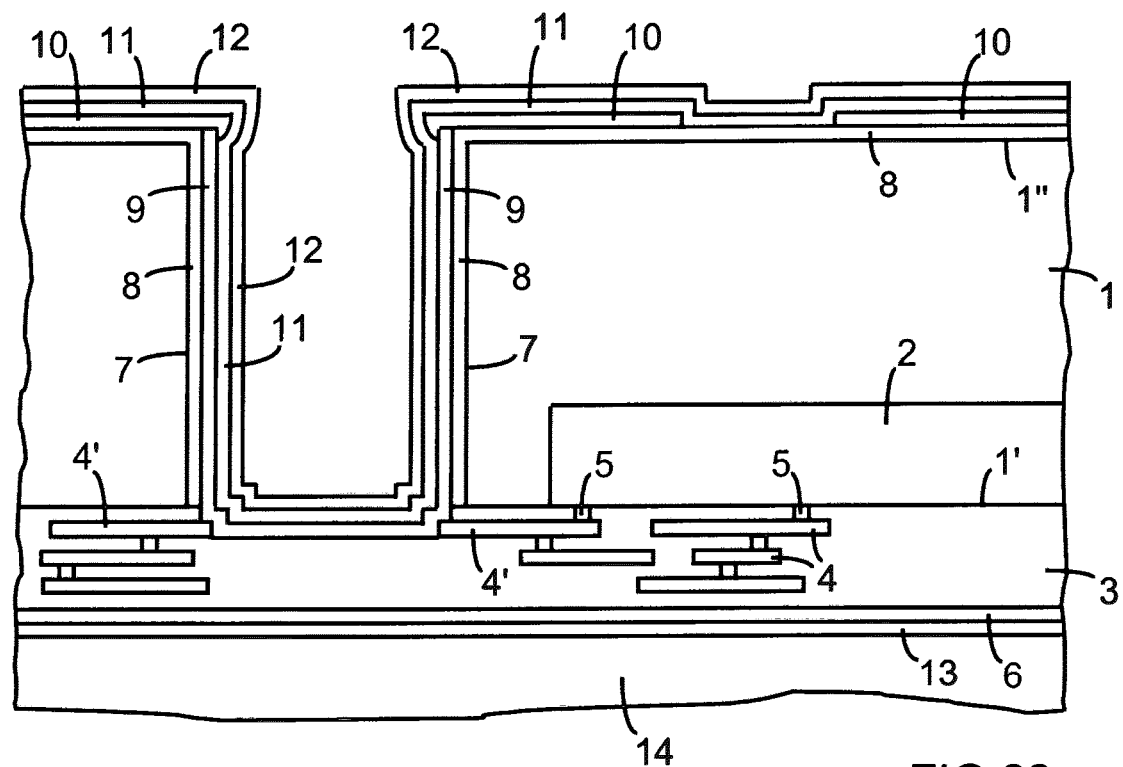
FIG. 22 is a cross section according to FIG. 4 after the application of a metallization in the via hole, a top metal and passivation layers.

FIG. 22 is a cross section according to FIG. 5 for an alternative method. The elements corresponding to elements shown in FIG. 5 are designated in FIG. 22 with the same reference numerals. FIG. 22 shows the via hole 7, the insulating layer 8, the metallization 9 in the via hole 7, the top metal 10, the passivation layer 11, the further passivation layer 12, the bonding layer 13 and the handling wafer 14. The metallization 9, the passivation layer 11 and the further passivation layer 12 are arranged on the sidewall and on the intermetal dielectric 3 at the bottom of the via hole 7. The metallization 9 contacts the contact area 4\* of one of the metal layers 4' of the wiring.

Figure 23:
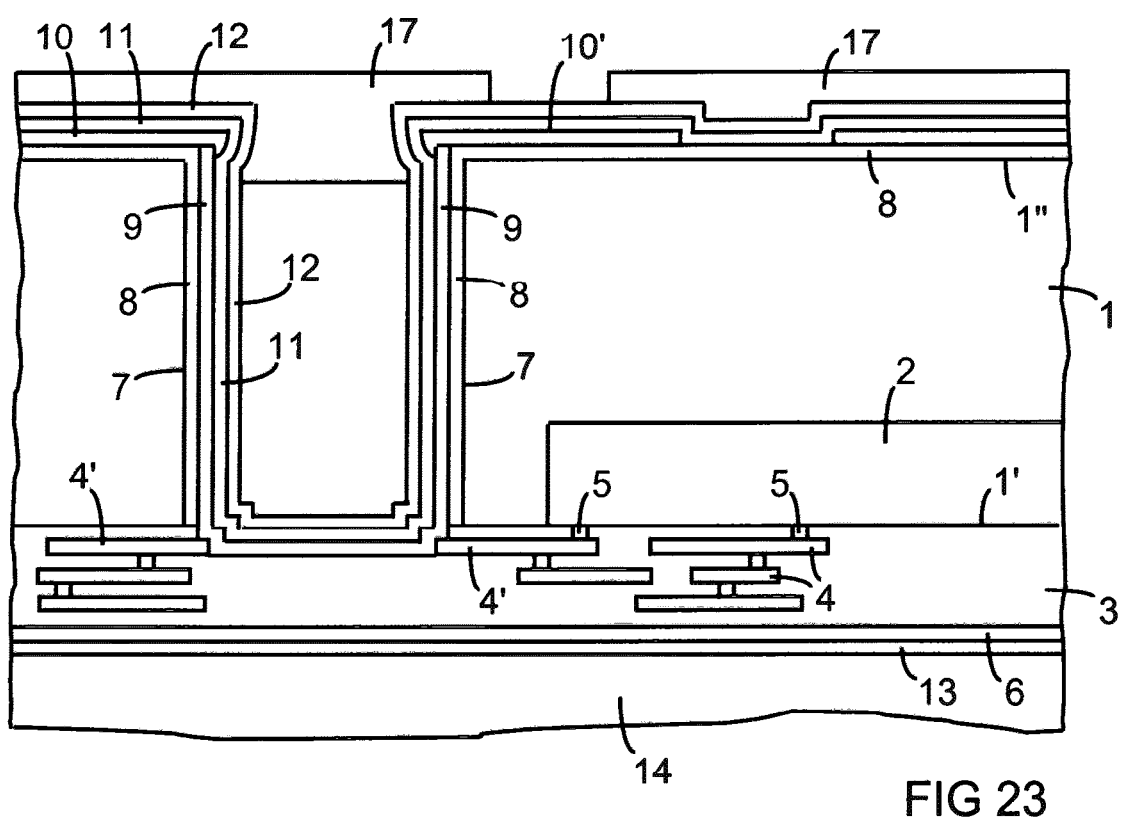
FIG. 23 is a cross section according to FIG. 22 after the application of the mask for structuring the passivation layers.

FIG. 23 is a cross section according to FIG. 22 after the application of the mask for structuring the passivation layers. This mask will be referred to as the further mask 17, since its purpose is similar to the purpose of the further mask 17 shown in FIG. 6. The further mask 17 is used to remove the passivation layer 11 and the further passivation layer 12 above a contact area 10' of the top metal 10.

Figure 24:
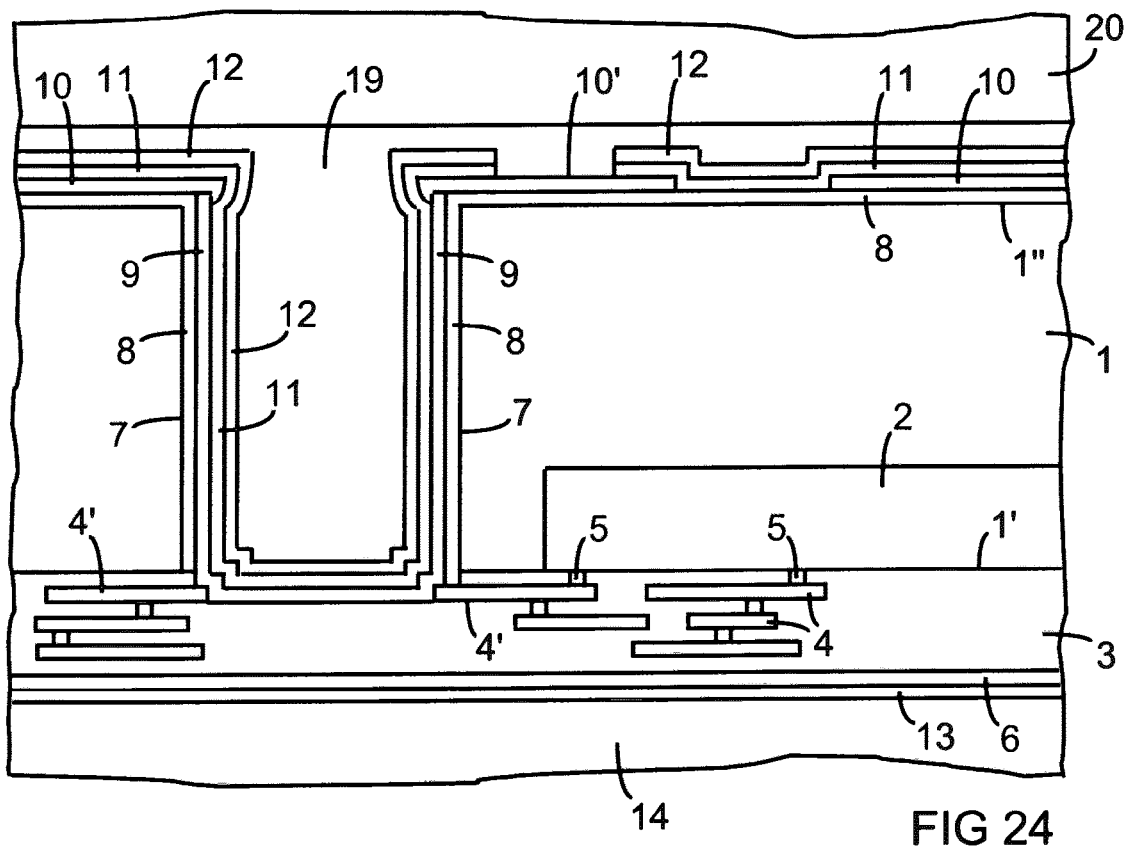
FIG. 24 is a cross section according to FIG. 23 after the passivation layers are structured and a further handling wafer is applied.

FIG. 24 is a cross section according to FIG. 23 after the passivation layers 11, 12 are structured and a further handling wafer 20 is applied. The further handling wafer 20 is fastened to the top surface of the device above the opposite surface 1" by a bonding and filler material 19, which may comprise an adhesive or an oxide of the semiconductor material, for instance. It may suffice to apply the bonding and filler material 19 only on the top surface outside the via hole 7, but the inner void of the via hole 7, which is not filled with the metallization 9, may be filled with the bonding and filler material 19 as well.

Figure 25:
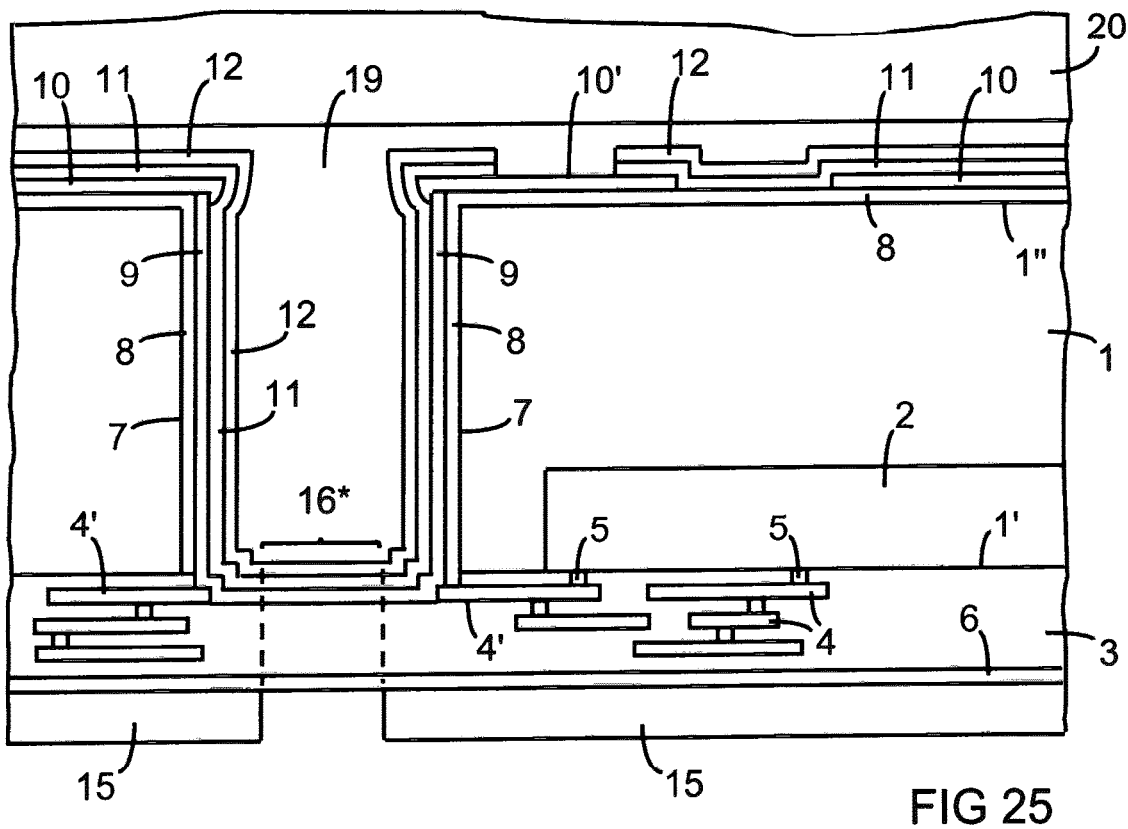
FIG. 25 is a cross section according to FIG. 24 after the handling wafer is replaced with a mask for forming a hole extending the via hole.

FIG. 25 is a cross section according to FIG. 24 after the handling wafer 14 is replaced with a mask for forming a hole extending the via hole 7. This mask will be referred to as the mask 15, since its purpose is similar to the purpose of the mask 15 shown in FIG. 4. The mask 15 may be a resist mask, for instance, and is arranged above the surface 1'. The mask 15 can be applied on the intermetal dielectric 3 or on the passivation layer 6 that is arranged on the intermetal dielectric 3. The mask 15 is used in an anisotropic etching step, whereby a hole is formed in the region 16\* that is present between the boundaries indicated in FIG. 25 by vertical broken lines.

Figure 26:
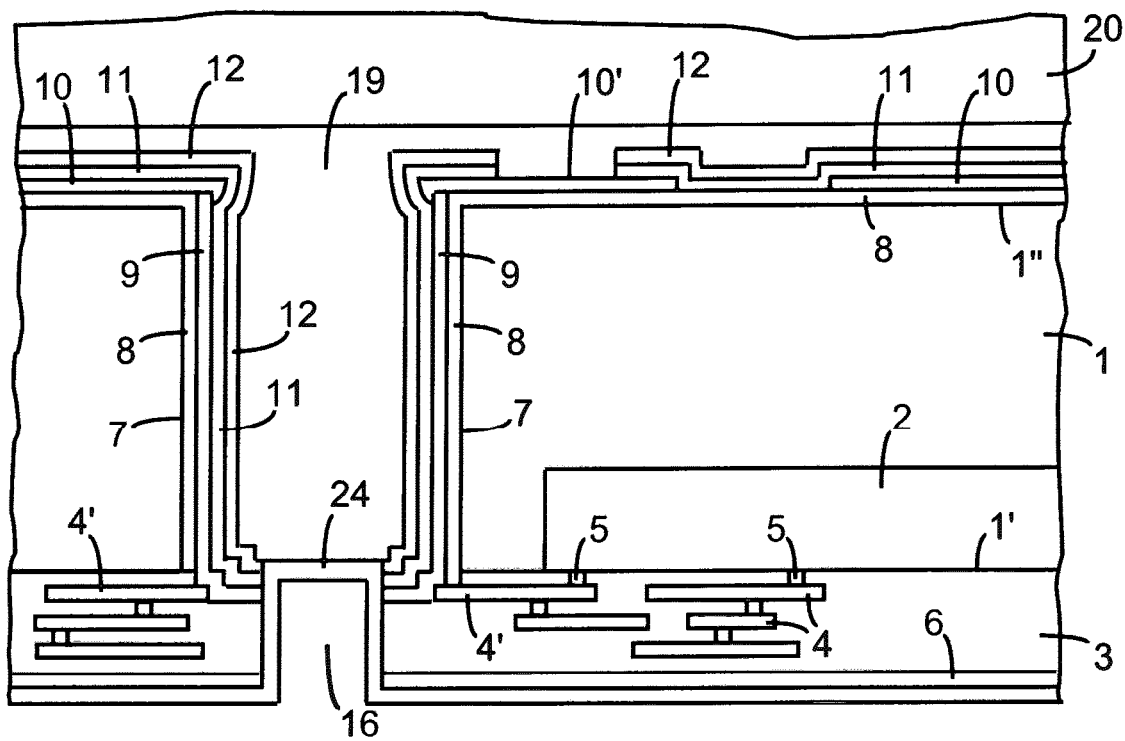
FIG. 26 is a cross section according to FIG. 25 after the formation of the hole extending the via hole, the removal of the mask and the application of a further passivation layer.

FIG. 26 is a cross section according to FIG. 25 after the etching step forming the hole 16 and after the removal of the mask 15. A further passivation layer 24, which may comprise $Si_3N_4$, for instance, is applied on the inner surfaces of the hole 16. Thus a continuous passivating layer is formed including the passivation layers 6, 11 and the further passivation layers 12, 24, and the passivation is not interrupted at the edges of the hole 16. The continuous passivation layer covers the other layers arranged at the sidewalls of the via hole 7. Therefore, the metallization 9 is arranged between the continuous passivation layer and the sidewalls of the via hole 7 in places. The continuous passivation layer directly adjoins the bonding and filler material 19.

Figure 27:
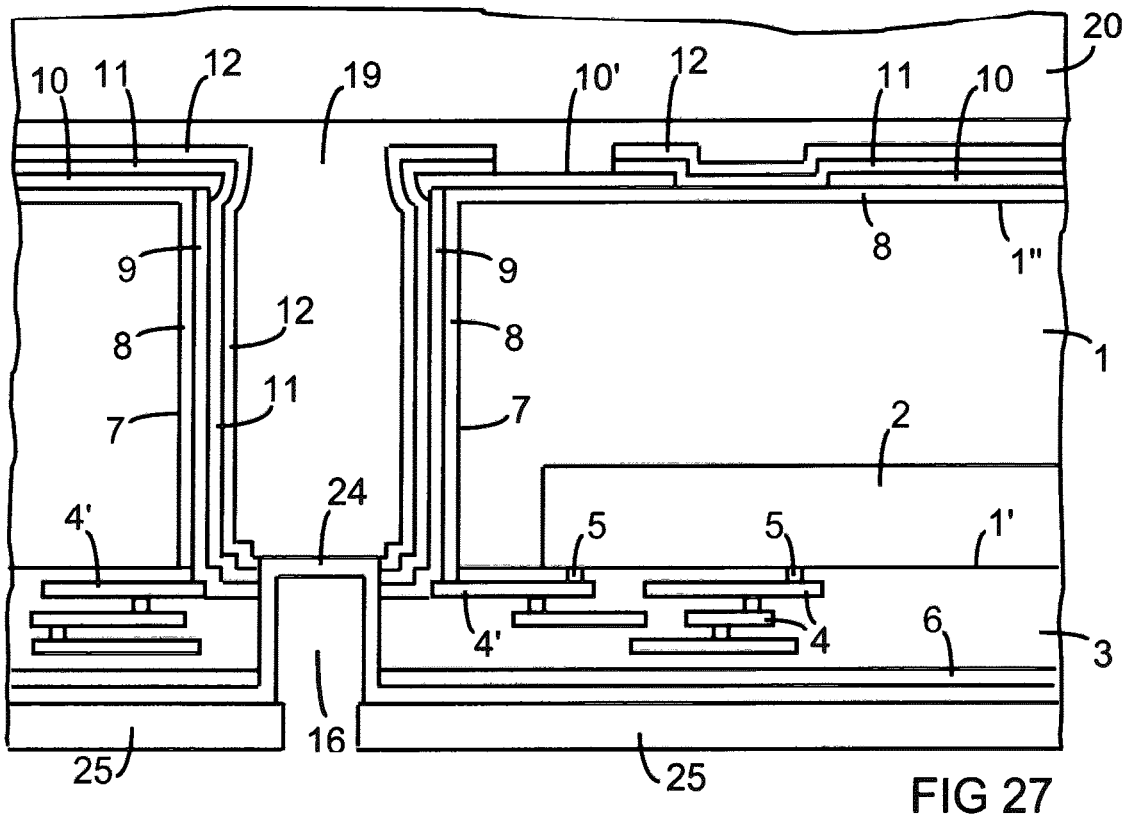
FIG. 27 is a cross section according to FIG. 26 after the application of a further mask for structuring the further passivation layer.

FIG. 27 is a cross section according to FIG. 26 after the application of a further mask 25 for structuring the further passivation layer 24 in the hole 16. The further mask 25 can be a further resist mask, for instance. It may be advantageous if the further mask 25 not only covers the point where the passivation layer 6 adjoins the further passivation layer 24, but slightly overhangs the portion of the further passivation layer 24 that is present on the sidewall of the hole 16.

Figure 28:
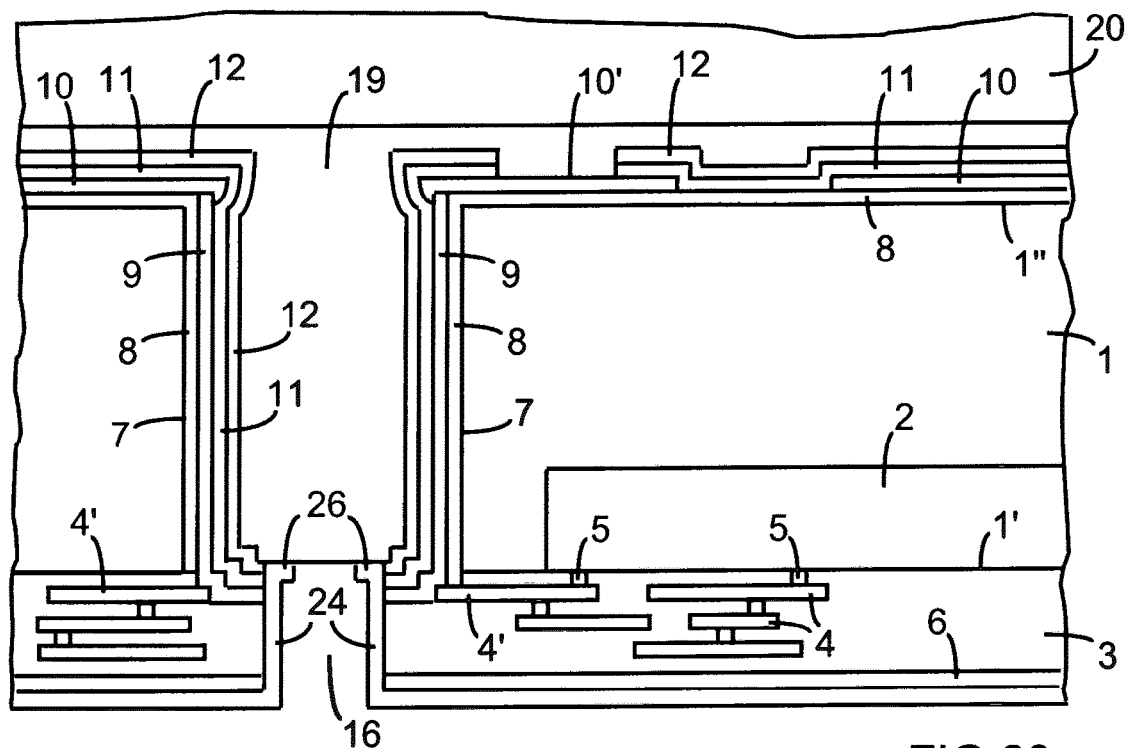
FIG. 28 is a cross section according to FIG. 27 after the bottom of the further passivation layer is removed.
Figure 29:
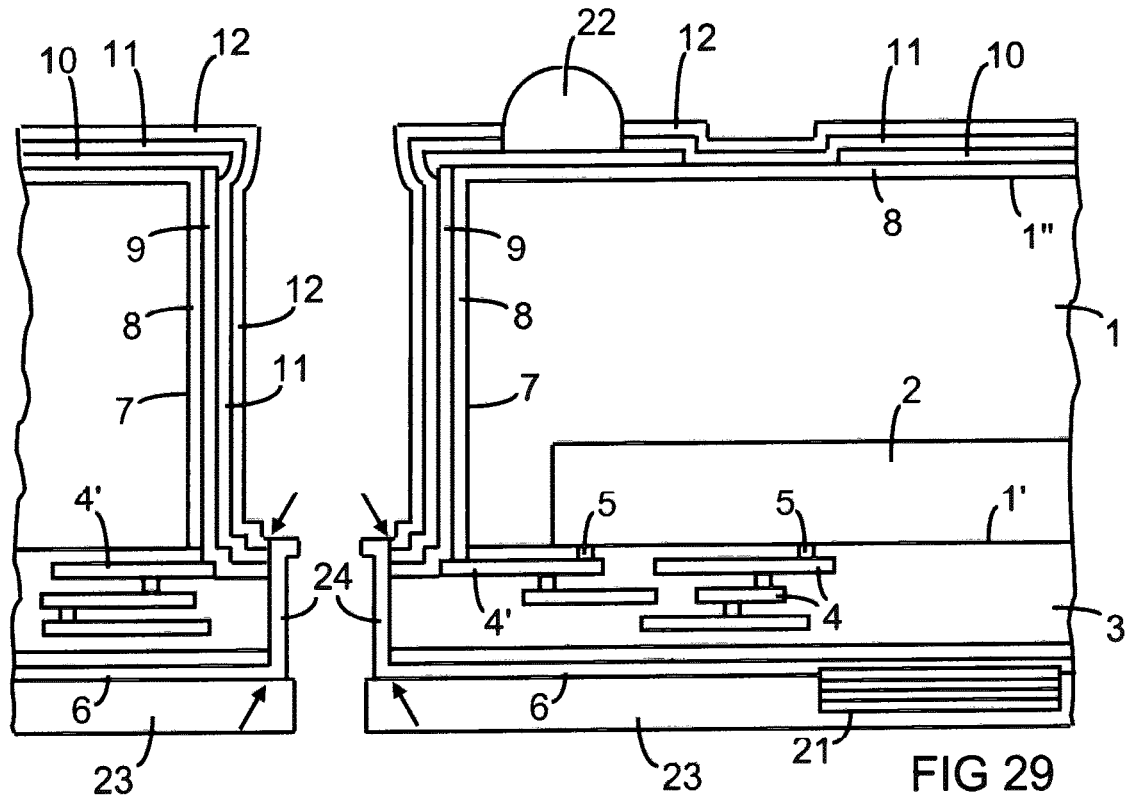
FIG. 29 is a cross section according to FIG. 28 after the removal of the further handling wafer and an application of solder balls and an optical component.

FIG. 28 is a cross section according to FIG. 27 after the bottom of the further passivation layer 24 is removed by an anisotropic etching step through the opening of the further mask 25. If the further mask 25 slightly overhangs the portion of the further passivation layer 24 that is present on the sidewall of the hole 16, the anisotropic etching step leaves small pedestals 26 at the bottom of the hole 16. This shape of the remaining further passivation layer 24 secures that the further passivation layers 12 and 24 adjoin each other and a continuous passivation is obtained. The metallization 9 is arranged between the continuous passivation and the sidewalls of the via hole 7 in places. The further mask 25 is then removed, and an optional component 21 can be mounted to the device as described above. FIG. 29 is a cross section according to FIG. 28 after the removal of the further handling wafer 20 and the bonding and filler material 19 and an application of a solder ball 22 on the contact area 10'. Thus a device structure that is essentially similar to the device shown in FIG. 11 is obtained. The via hole 7 together with the hole 16 extends completely through the semiconductor device. In FIG. 29, arrows indicate the points where the passivation layers 6, 11, 12, 24 abut in order to achieve a continuous passivation of the surfaces inside and outside the via hole 7. The uninterrupted passivation is a further major advantage of the described semiconductor devices and manufacturing methods.

Figures 30, 31:
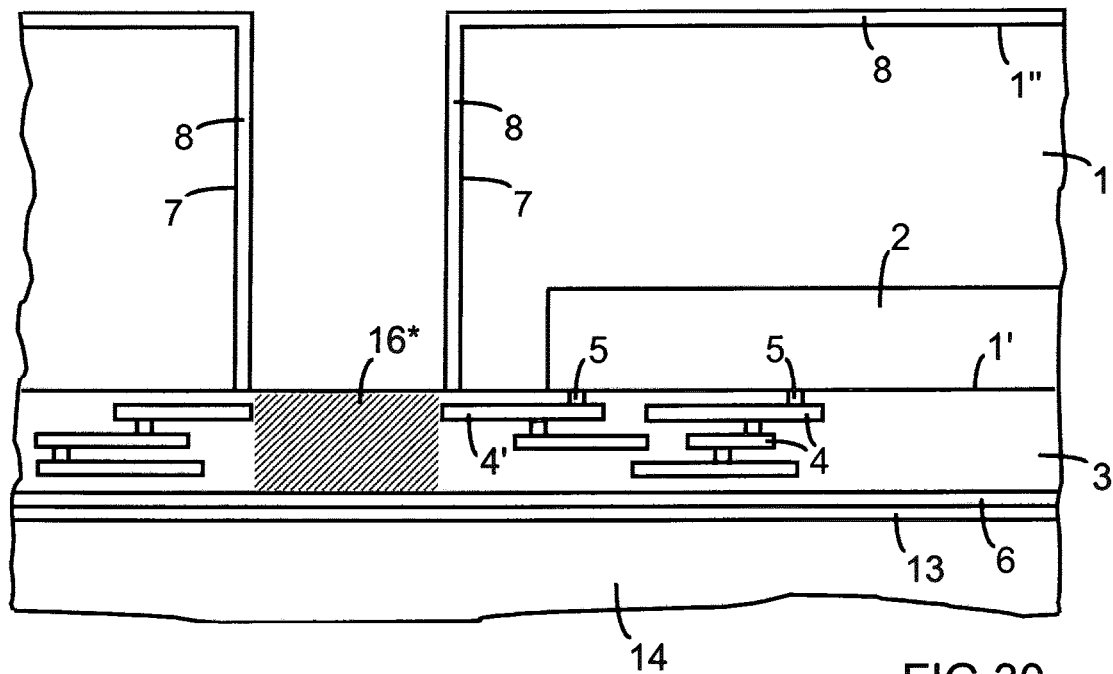
FIG. 30 is a cross section according to FIG. 1, including an indication of a region of material to be removed.
FIG. 31 is a cross section according to FIG. 30 after the application of a metallization in the via hole and the hole extending the via hole.

FIG. 30 is a cross section according to FIG. 1, including an indication of a region 16* of the intermetal dielectric 3 to be removed in order to obtain an alternative device structure.

FIG. 31 is a cross section according to FIG. 30 after the formation of the hole 16, which extends to the passivation layer 6. The metallization 9 contacts the metal layer 4' laterally, so that the metallization 9 forms a smooth layer on the sidewall.

Figure 32:
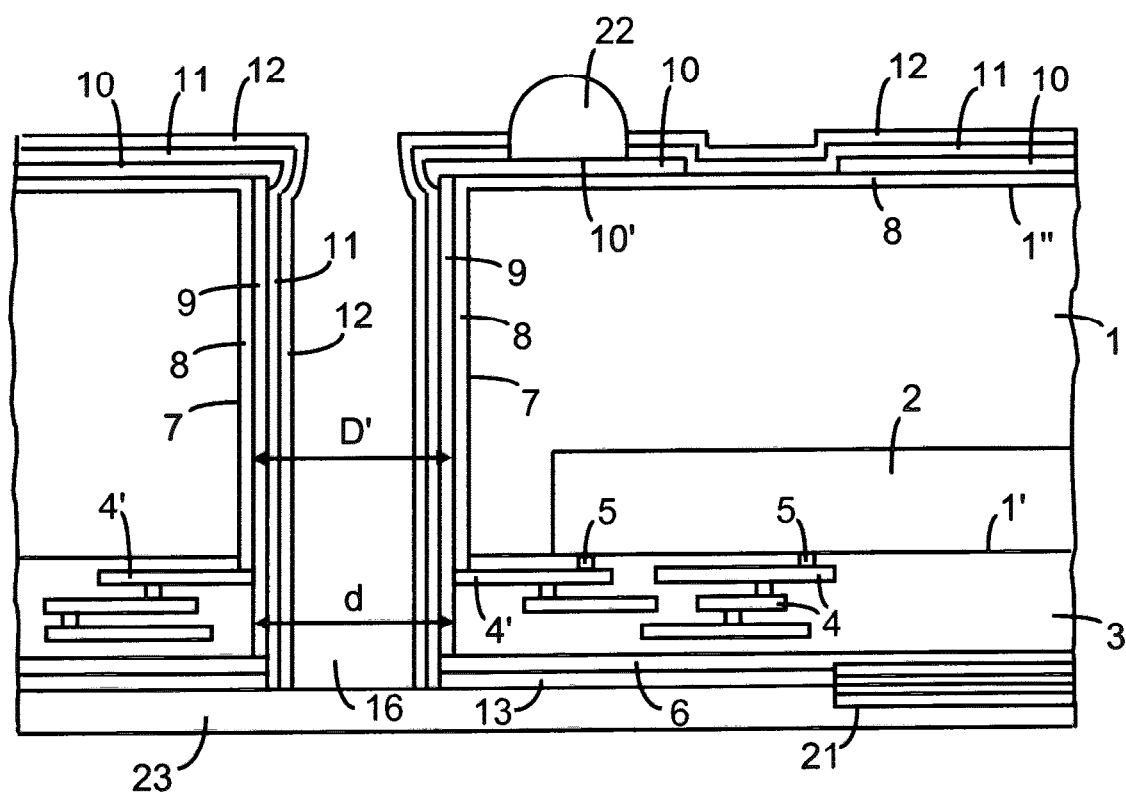
FIG. 32 is a cross section according to FIG. 31 after an application of solder balls and an optical component.

FIG. 32 is a cross section according to FIG. 31 after an application of solder balls and an optical component. The device thus obtained corresponds to the devices shown in FIGS. 11 and 29, but differs in the feature that the diameter of the hole d and the outer diameter of the metallization D' are equal.

In the described device, the risks incurred by the presence of the layer membrane at the bottom of the through-substrate via are avoided. In some instances, the described through-substrate vias have the advantage that they are capable of simultaneously transmitting optical and electrical signals. In comparison with a closed structure comprising transparent layers, the described structure enhances the optical transmission, since a material interface causing absorption or diffraction is avoided. The described method can favourably be used to produce wafer-level chip-scale packages with mechanically stable through-substrate vias.

The invention claimed is:

1. A semiconductor device, comprising:
a substrate of semiconductor material;
an intermetal dielectric on the substrate;
metal layers embedded in the intermetal dielectric;
a contact area of one of the metal layers;
a via hole in the substrate opposite the contact area;
a metallization arranged in the via hole, the metallization being in contact with the contact area; and
a passivation layer, the intermetal dielectric being arranged between the substrate and the passivation layer,
wherein
a hole is arranged in the intermetal dielectric, the hole forming an extension of the via hole,
a continuous passivation is arranged on sidewalls within the via hole and the hole,
the metallization is in contact with the contact area around the hole,
the via hole together with the hole extends completely through the semiconductor device, and
the passivation layer abutting the continuous passivation arranged on the sidewall within the hole.

2. The semiconductor device of claim 1, wherein the metallization is arranged between the continuous passivation and the sidewalls of the via hole at least in places.

3. The semiconductor device of claim 1, wherein an insulating layer is arranged on a sidewall of the via hole, and the metallization forms a layer on the insulating layer.

4. The semiconductor device of claim 1, wherein the metallization comprises an inner diameter inside the via hole, the hole comprises an inner diameter parallel to the inner diameter of the metallization, and the inner diameter of the metallization is larger than the inner diameter of the hole.

5. The semiconductor device of claim 1, wherein the metallization comprises an outer diameter inside the via hole, the hole comprises an inner diameter parallel to the outer diameter of the metallization, and the outer diameter of the metallization equals the inner diameter of the hole.

6. The semiconductor device of claim 1, wherein
the continuous passivation is formed by a continuous passivation layer.

7. The semiconductor device of claim 1, further comprising:
a passivation layer of the continuous passivation in the via hole,
a further passivation layer of the continuous passivation in the hole, and
the passivation layer of the continuous passivation abutting the further passivation layer of the continuous passivation.

8. The semiconductor device of claim 7, further comprising:
a pedestal formed by the further passivation layer where the further passivation layer abuts the passivation layer.

9. A device comprising a semiconductor device according to claim 1, the device being at least one of: a photonic device, high-frequency photonic device, 3D camera, structured light camera, time-of-flight camera, stereoscopic imaging device, CMOS imaging sensor, rolling shutter image sensor, line scan image sensor, camera module, lidar detector, ambient light sensor, colour sensor, proximity sensor, gesture sensor, device for optical character recognition or edge detection, photocopier, document scanner, spectral sensing device and spectrum analyzer.

10. A method of producing a semiconductor device, comprising:
arranging an intermetal dielectric and metal layers embedded in the intermetal dielectric on a bottom surface of a substrate of semiconductor material, the bottom surface facing an opposite surface;
forming a via hole in the substrate;
applying a metallization in the via hole, the metallization contacting a contact area of one of the metal layers;
applying a mask comprising an opening above the via hole;
forming a hole by partially removing the metallization, the metal layer comprising the contact area and the intermetal dielectric through the opening of the mask, the hole penetrating the intermetal dielectric and extending the via hole;
forming a continuous passivation on sidewalls within the via hole and the hole;
arranging a passivation layer on the intermetal dielectric opposite the bottom surface of the substrate; and
forming the continuous passivation abutting the passivation layer,
wherein the via hole together with the hole extends completely through the semiconductor device.

11. The method of claim 10, wherein
the mask is applied at a side of the semiconductor device facing the bottom surface of the substrate, and
before the hole is formed, a further passivation layer is applied on the sidewall within the via hole, and
after the hole is formed, a further passivation layer is applied on the sidewall within the hole, the further passivation layers forming the continuous passivation.

12. The method of claim 10, wherein
the mask is applied at a side of the semiconductor device facing an opposite surface of the substrate, and
after the hole is formed, a further passivation layer is applied on the sidewalls within the via hole and the hole to form the continuous passivation.

13. The method of claim 12, wherein
before the hole is formed, a handling wafer is attached to the intermetal dielectric,
the further passivation layer is applied, a bottom portion of the further passivation layer covering an area of the handling wafer at the bottom of the hole, and
the bottom portion of the further passivation layer is removed using a further mask, which is applied at a side of the semiconductor device facing the opposite surface of the substrate.

14. The method of claim 12, wherein
before the hole is formed, a handling wafer is attached to the intermetal dielectric,
the further passivation layer is applied, a bottom portion of the further passivation layer covering an area of the handling wafer at the bottom of the hole,
the handling wafer is removed, and
the bottom portion of the further passivation layer is removed from the side where the handling wafer was attached.

15. A method of producing a semiconductor device, comprising:
arranging an intermetal dielectric and metal layers embedded in the intermetal dielectric on a bottom surface of a substrate of semiconductor material, the bottom surface facing an opposite surface;
forming a via hole in the substrate;
applying a metallization in the via hole, the metallization contacting a contact area of one of the metal layers;
applying a mask comprising an opening above the via hole;
forming a hole by partially removing the metallization, the metal layer comprising the contact area and the intermetal dielectric through the opening of the mask, the hole penetrating the intermetal dielectric and extending the via hole; and
forming a continuous passivation on sidewalls within the via hole and the hole,
wherein
the via hole together with the hole extends completely through the semiconductor device,
the mask is applied at a side of the semiconductor device facing an opposite surface of the substrate,
after the hole is formed, a further passivation layer is applied on the sidewalls within the via hole and the hole to form the continuous passivation,
before the hole is formed, a handling wafer is attached to the intermetal dielectric,
the further passivation layer is applied, a bottom portion of the further passivation layer covering an area of the handling wafer at the bottom of the hole,
the handling wafer is removed, and
the bottom portion of the further passivation layer is removed from the side where the handling wafer was attached.

* * * * *